United States Patent
Yamazaki

(10) Patent No.: US 8,748,243 B2
(45) Date of Patent: Jun. 10, 2014

(54) DISPLAY DEVICE, METHOD FOR MANUFACTURING DISPLAY DEVICE, AND SOI SUBSTRATE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/249,308

(22) Filed: Sep. 30, 2011

(65) Prior Publication Data

US 2012/0021544 A1  Jan. 26, 2012

Related U.S. Application Data

(62) Division of application No. 12/076,789, filed on Mar. 24, 2008, now Pat. No. 8,048,728.

(30) Foreign Application Priority Data

Apr. 13, 2007  (JP) .................................. 2007-106578

(51) Int. Cl.
*H01L 21/786* (2006.01)
*H01L 21/84* (2006.01)

(52) U.S. Cl.
USPC ........... 438/162; 438/164; 438/458; 438/459; 257/E21.568

(58) Field of Classification Search
USPC ........... 438/162, 164, 458, 459; 257/E21.568
See application file for complete search history.

(56) References Cited

U.S. PATENT DOCUMENTS

| 4,566,175 A | 1/1986 | Smayling et al. |
| 4,669,177 A | 6/1987 | D'arrigo et al. |
| 5,374,564 A | 12/1994 | Bruel |
| 5,413,951 A | 5/1995 | Ohori et al. |
| 5,524,339 A | 6/1996 | Gorowitz et al. |
| 5,559,043 A | 9/1996 | Bruel |
| 5,567,654 A | 10/1996 | Beilstein et al. |

(Continued)

FOREIGN PATENT DOCUMENTS

| CN | 001492481 | 4/2004 |
| EP | 1 045 448 | 10/2000 |

(Continued)

OTHER PUBLICATIONS

International Search Report (Application No. PCT/JP2008/055172) dated Jun. 24, 2008.

(Continued)

*Primary Examiner* — Zandra Smith
*Assistant Examiner* — Toniae Thomas
(74) *Attorney, Agent, or Firm* — Eric J. Robinson; Robinson Intellectual Property Law Office, P.C.

(57) ABSTRACT

A manufacturing method is provided which achieves an SOI substrate with a large area and can improve productivity of manufacture of a display device using the SOI substrate. A plurality of single-crystalline semiconductor layers are bonded to a substrate having an insulating surface, and a circuit including a transistor is formed using the single-crystalline semiconductor layers, so that a display device is manufactured. Single-crystalline semiconductor layers separated from a single-crystalline semiconductor substrate are applied to the plurality of single-crystalline semiconductor layers. Each of the single-crystalline semiconductor layers has a size corresponding to one display panel (panel size).

19 Claims, 26 Drawing Sheets

(56) References Cited

U.S. PATENT DOCUMENTS

| | | | |
|---|---|---|---|
| 5,618,739 A | 4/1997 | Takahashi et al. | |
| 5,622,896 A | 4/1997 | Knotter et al. | |
| 6,013,563 A | 1/2000 | Henley et al. | |
| 6,020,252 A | 2/2000 | Aspar et al. | |
| 6,127,702 A | 10/2000 | Yamazaki et al. | |
| 6,190,998 B1 | 2/2001 | Bruel et al. | |
| 6,225,192 B1 | 5/2001 | Aspar et al. | |
| 6,242,320 B1 | 6/2001 | So | |
| 6,271,101 B1 | 8/2001 | Fukunaga | |
| 6,312,797 B1 | 11/2001 | Yokokawa et al. | |
| 6,335,231 B1 | 1/2002 | Yamazaki et al. | |
| 6,337,288 B1 | 1/2002 | Ohya et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| RE38,296 E | 11/2003 | Moriuchi et al. | |
| 6,686,623 B2 | 2/2004 | Yamazaki | |
| 6,759,277 B1 | 7/2004 | Flores et al. | |
| 6,778,164 B2 | 8/2004 | Yamazaki et al. | |
| 6,803,264 B2 | 10/2004 | Yamazaki et al. | |
| 6,818,529 B2 | 11/2004 | Bachrach et al. | |
| 6,875,633 B2 | 4/2005 | Fukunaga | |
| 6,908,797 B2 | 6/2005 | Takano | |
| 6,946,365 B2 | 9/2005 | Aspar et al. | |
| 7,119,365 B2 | 10/2006 | Takafuji et al. | |
| RE39,484 E | 2/2007 | Bruel | |
| 7,176,525 B2 | 2/2007 | Fukunaga | |
| 7,176,528 B2 | 2/2007 | Couillard et al. | |
| 7,192,844 B2 | 3/2007 | Couillard et al. | |
| 7,199,024 B2 | 4/2007 | Yamazaki | |
| 7,253,040 B2 | 8/2007 | Itoga et al. | |
| 7,256,776 B2 | 8/2007 | Yamazaki et al. | |
| 7,358,158 B2 | 4/2008 | Aihara et al. | |
| 7,399,681 B2 | 7/2008 | Couillard et al. | |
| 7,473,971 B2 | 1/2009 | Yamazaki et al. | |
| 7,476,576 B2 | 1/2009 | Yamazaki et al. | |
| 7,476,940 B2 | 1/2009 | Couillard et al. | |
| 7,508,034 B2 | 3/2009 | Takafuji et al. | |
| 7,531,240 B2 | 5/2009 | Xianyu et al. | |
| 7,535,053 B2 | 5/2009 | Yamazaki | |
| 7,605,053 B2 | 10/2009 | Couillard et al. | |
| 7,619,250 B2 | 11/2009 | Takafuji et al. | |
| 7,632,739 B2 | 12/2009 | Hebras | |
| 7,709,309 B2 | 5/2010 | Moriwaka | |
| 7,790,570 B2 | 9/2010 | Yamazaki | |
| 7,816,736 B2 | 10/2010 | Yamazaki | |
| 7,834,398 B2 | 11/2010 | Yamazaki | |
| 7,838,935 B2 | 11/2010 | Couillard et al. | |
| 7,978,190 B2 | 7/2011 | Yamazaki et al. | |
| 2002/0109144 A1 | 8/2002 | Yamazaki | |
| 2003/0183876 A1 | 10/2003 | Takafuji et al. | |
| 2004/0061176 A1* | 4/2004 | Takafuji et al. | 438/162 |
| 2004/0092087 A1 | 5/2004 | Aspar et al. | |
| 2004/0238851 A1 | 12/2004 | Flores et al. | |
| 2005/0032283 A1 | 2/2005 | Itoga et al. | |
| 2005/0098827 A1 | 5/2005 | Kanegae | |
| 2005/0260800 A1 | 11/2005 | Takano | |
| 2006/0038228 A1 | 2/2006 | Aitken et al. | |
| 2006/0099773 A1 | 5/2006 | Maa et al. | |
| 2006/0110899 A1 | 5/2006 | Bourdelle et al. | |
| 2007/0020947 A1 | 1/2007 | Daval et al. | |
| 2007/0063281 A1 | 3/2007 | Takafuji et al. | |
| 2007/0108510 A1 | 5/2007 | Fukunaga | |
| 2007/0173000 A1 | 7/2007 | Yamazaki | |
| 2008/0061301 A1 | 3/2008 | Yamazaki | |
| 2008/0067529 A1 | 3/2008 | Yamazaki | |
| 2008/0171443 A1 | 7/2008 | Hebras | |
| 2008/0213953 A1 | 9/2008 | Yamazaki | |
| 2008/0237779 A1 | 10/2008 | Yamazaki et al. | |
| 2008/0237780 A1 | 10/2008 | Yamazaki et al. | |
| 2008/0242051 A1* | 10/2008 | Yamazaki et al. | 438/458 |
| 2008/0246109 A1 | 10/2008 | Ohnuma et al. | |
| 2008/0286941 A1 | 11/2008 | Yamazaki | |
| 2008/0286942 A1 | 11/2008 | Yamazaki | |
| 2009/0023267 A1 | 1/2009 | Daval et al. | |
| 2009/0023271 A1 | 1/2009 | Couillard et al. | |
| 2009/0095956 A1 | 4/2009 | Takafuji et al. | |
| 2009/0107967 A1 | 4/2009 | Sakamoto et al. | |
| 2010/0019242 A1 | 1/2010 | Takafuji et al. | |
| 2012/0012972 A1 | 1/2012 | Takafuji et al. | |

FOREIGN PATENT DOCUMENTS

| | | |
|---|---|---|
| JP | 64-061943 | 3/1989 |
| JP | 05-211128 | 8/1993 |
| JP | 11-045862 | 2/1999 |
| JP | 11-163363 | 6/1999 |
| JP | 2000-012864 | 1/2000 |
| JP | 2002-198328 | 7/2002 |
| JP | 2003-282885 | 10/2003 |
| JP | 2003-324188 | 11/2003 |
| JP | 2004-134675 A | 4/2004 |
| JP | 2004-260170 | 9/2004 |
| JP | 2004-356537 | 12/2004 |
| JP | 2005-056917 | 3/2005 |
| JP | 2005-252244 A | 9/2005 |
| JP | 2006-032435 A | 2/2006 |
| JP | 2006-191102 A | 7/2006 |
| WO | WO 00/24059 | 4/2000 |
| WO | WO 2008/087516 | 7/2008 |

OTHER PUBLICATIONS

Written Opinion (Application No. PCT/JP2008/055172) dated Jun. 24, 2008.

International Search Report (Application No. PCT/JP2008/055168) dated Jun. 24, 2008.

Written Opinion (Application No. PCT/JP2008/055168) dated Jun. 24, 2008.

International Search Report (Application No. PCT/JP2008/055167) dated Jun. 17, 2008.

Written Opinion (Application No. PCT/JP2008/055167) dated Jun. 17, 2008.

Lu et al., "Ion-Cutting of Si Onto Glass by Pulsed and Direct-Current Plasma Immersion Ion Implantation," J. Vac. Sci. Technol. B (Journal of Vacuum Science & Technology B), 2003, vol. 21, No. 5, pp. 2109-2113.

Chinese Office Action (Application No. 201210081386.4) Dated Jan. 10, 2014.

* cited by examiner

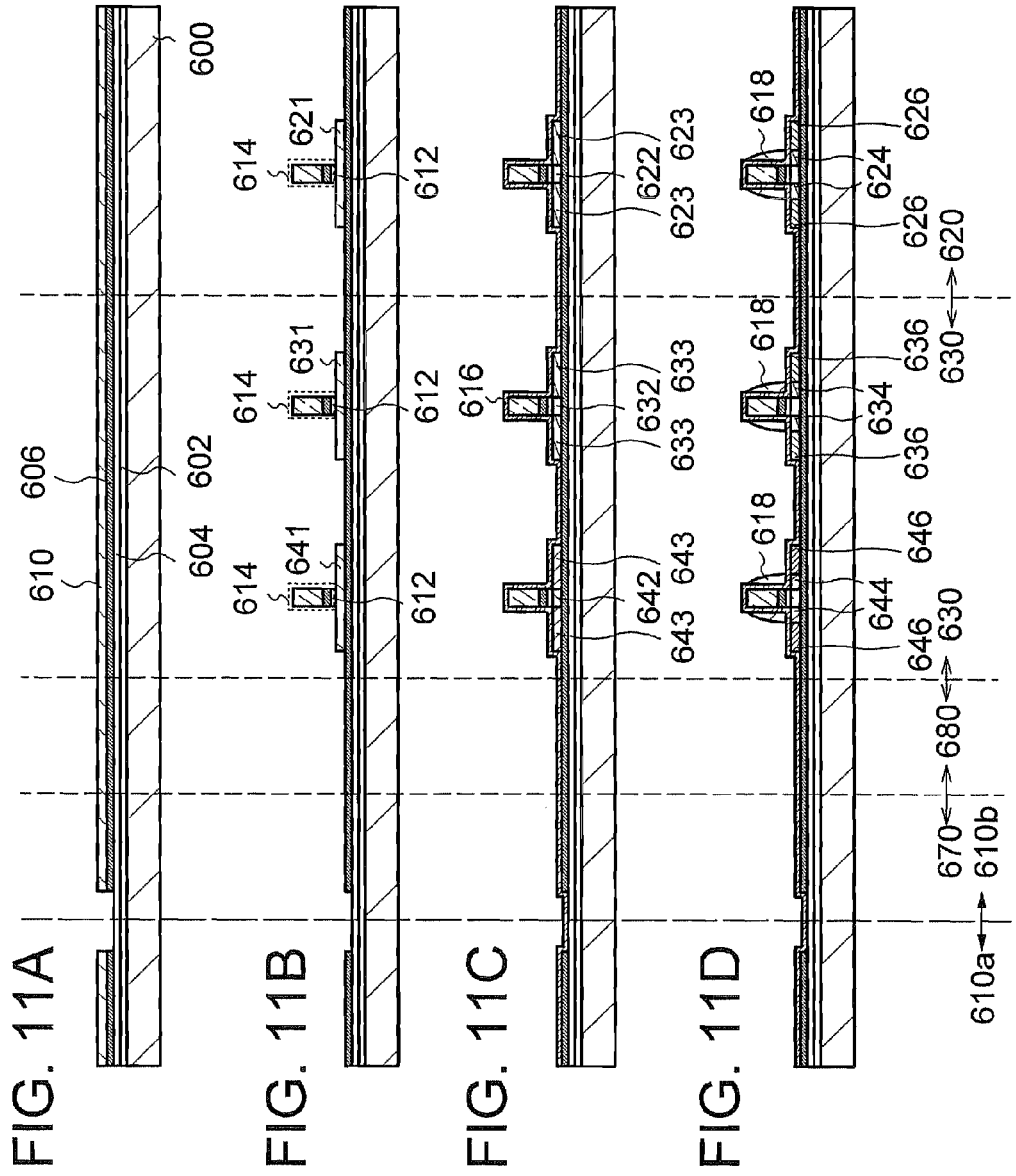

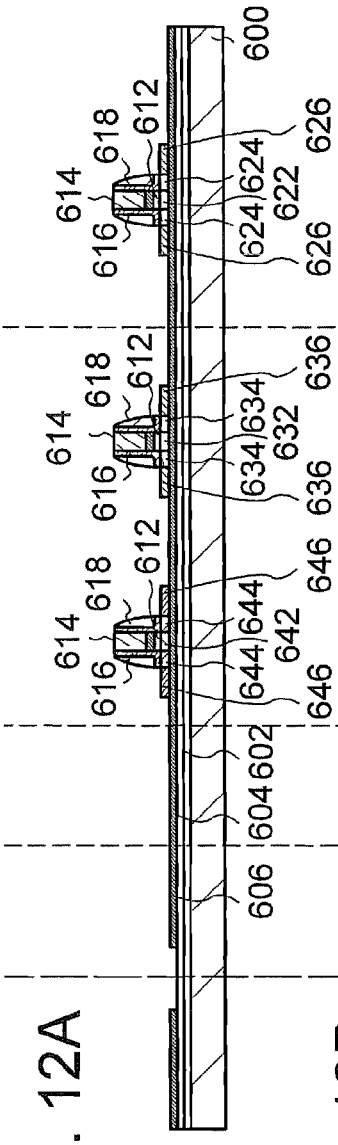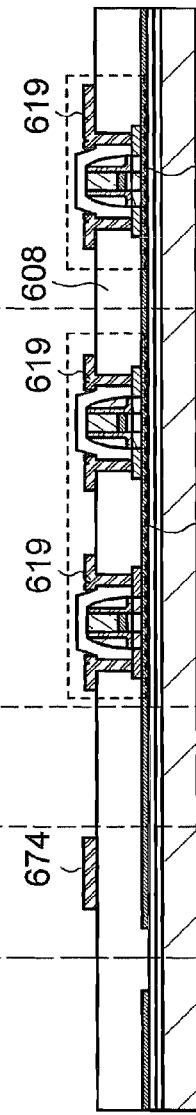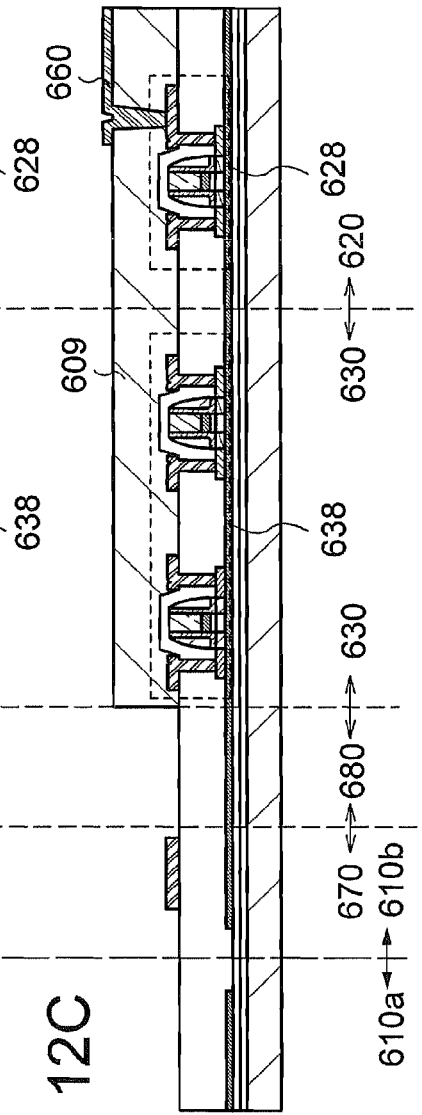

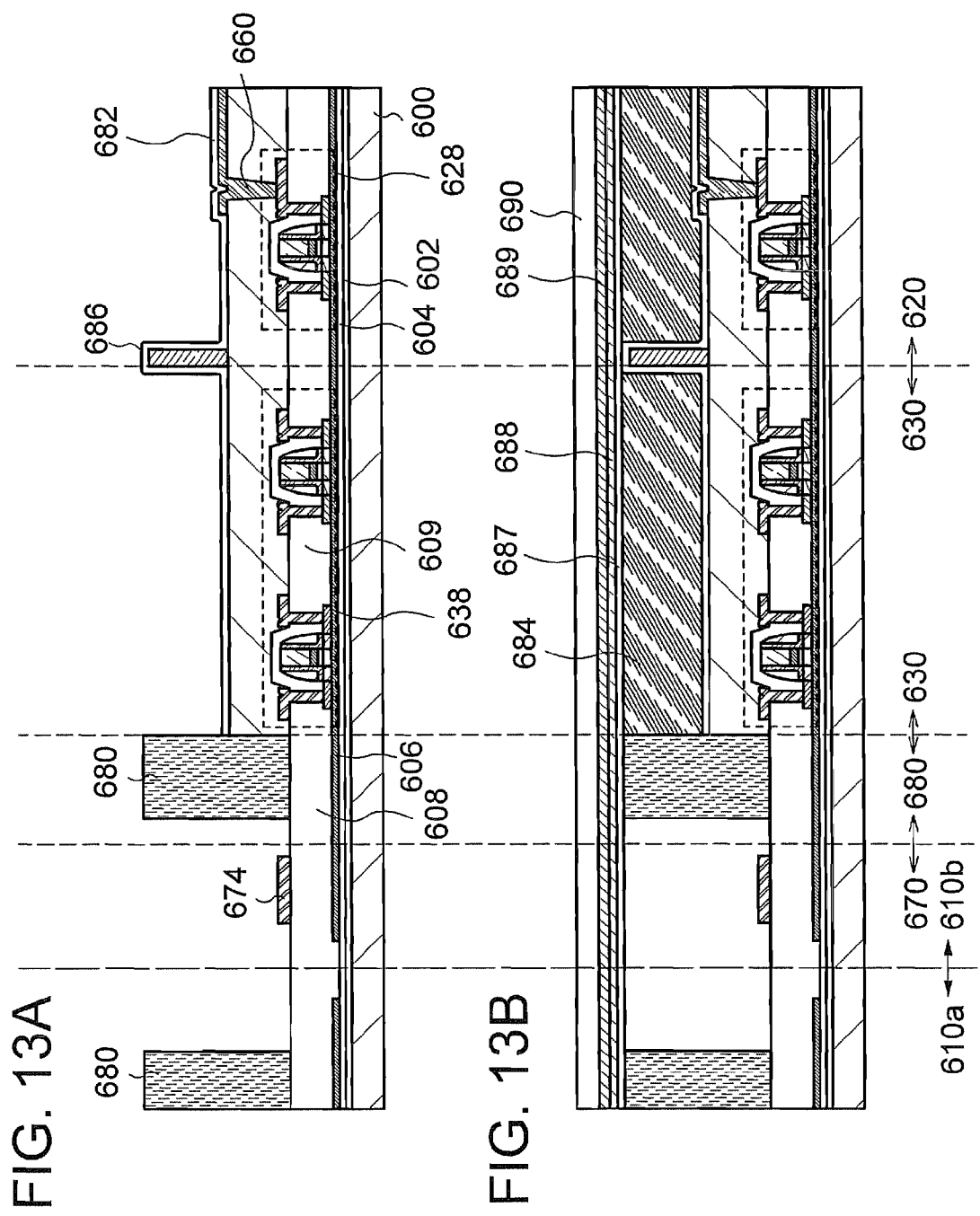

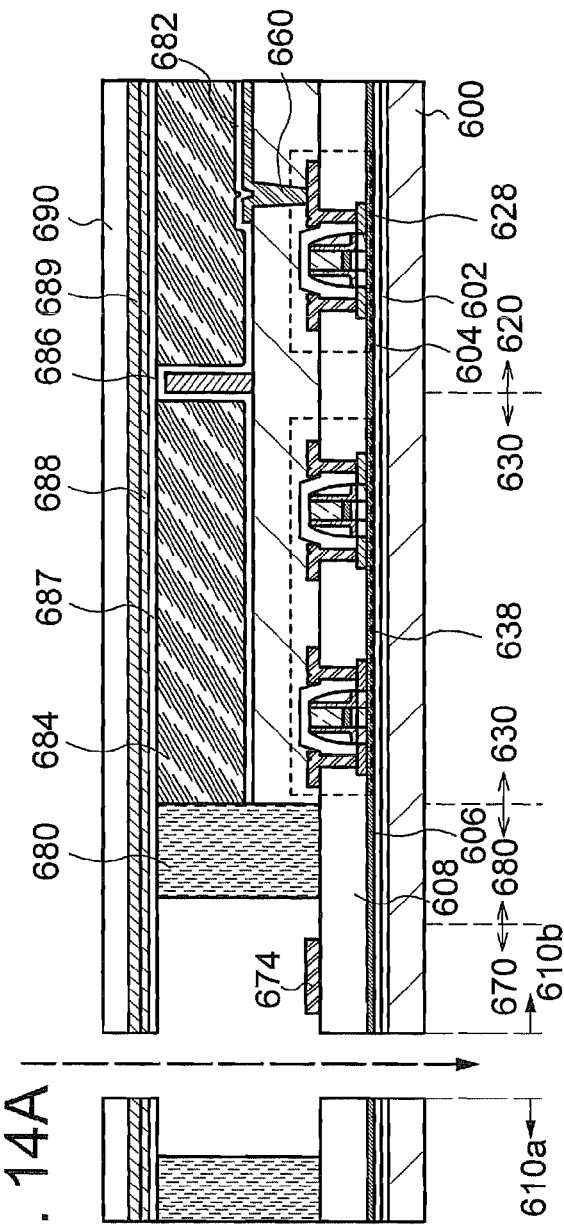
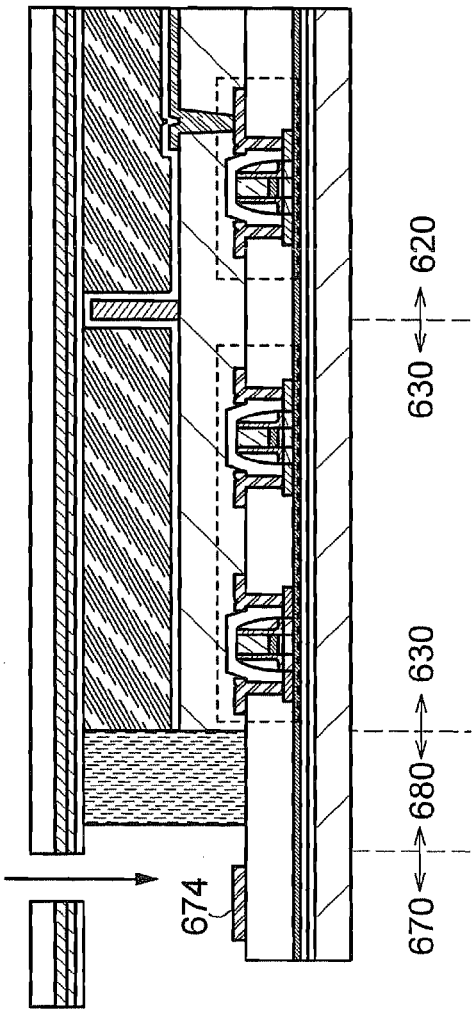
FIG. 14A
FIG. 14B

DISPLAY DEVICE, METHOD FOR MANUFACTURING DISPLAY DEVICE, AND SOI SUBSTRATE

TECHNICAL FIELD

The present invention relates to an SOI (silicon on insulator) substrate and a display device that is manufactured using the SOI substrate. In particular, the present invention relates to a bonding SOI technology, an SOI substrate formed by bonding a single-crystalline or polycrystalline semiconductor layer to a substrate having an insulating surface (e.g. a glass), and a display device that is manufactured using the SOI substrate.

BACKGROUND ART

With a quantum leap in VLSI technology in recent years, an SOI structure, which enables high-speed operation and low power consumption, has been attracting attention. In this technology, an active region (channel formation region) of a field-effect transistor (FET), which is conventionally formed with bulk single-crystalline silicon, is formed with a single-crystalline silicon thin film. It is known that use of the SOI structure enables manufacturing a MOS field-effect transistor with smaller parasitic capacitance than in the conventional case of using a bulk single-crystalline silicon substrate, and is advantageous to high speed operation.

As a method for manufacturing a conventional SOI substrate, a hydrogen ion implanting separation method is known (for example, refer to Reference 1: PCT International Publication No. 00/24059). In the hydrogen ion implanting separation method, a microbubble layer is formed at a given depth from a surface by implanting hydrogen ions into a silicon wafer to make the microbubble layer a cleavage plane, so that a thin single-crystalline silicon layer (SOI layer) is bonded to another silicon wafer; in addition to performing heat treatment for separating the SOI layer, Reference 1 describes that a bonding strength needs to be enhanced by forming an oxide film on the SOI layer by heat treatment in an oxidation atmosphere, removing the oxide film, and performing heat treatment in a reduction atmosphere at 1000 to 1300° C.

As an example of a semiconductor device utilizing an SOI substrate, a semiconductor device by the present applicant is known (refer to Reference 2: Japanese Published Patent Application No. 2000-12864). Reference 2 also discloses that heat treatment at temperatures of 1050 to 1150° C. is necessary in order to remove a level or a defect due to a stress in the SOI layer.

DISCLOSURE OF INVENTION

A method for manufacturing a conventional SOI substrate needs heat treatment at high temperatures of 1000° C. or higher in order to ensure a high bonding strength of the SOI layer. Therefore, it is difficult to form an SOI layer over a substrate with a heat-resistant temperature of about 600° C. (e.g. a glass substrate, which can be used for manufacturing a display device such as a liquid crystal panel). Even if an SOI layer is provided over a glass substrate by a hydrogen ion implanting separation method, heat treatment at a high temperature cannot be applied; therefore, there is a problem in that the bonding strength of the SOI layer is low. Further, in a conventional SOI substrate utilizing a hydrogen ion implanting separation method, an SOI structure is obtained by bonding one sheet of silicon wafer to another sheet of silicon wafer and thinning one of the silicon wafers. Therefore, the conventional SOI substrate utilizing a hydrogen ion implanting separation method depends on the size of a silicon wafer, and it is difficult to have a large area.

In view of the above problems, an object of the present invention is to have a large area in an SOI substrate and improve the productivity of manufacturing display devices utilizing the SOI substrate. Further, another object is high performance of the display devices.

A plurality of single-crystalline semiconductor layers are bonded to a substrate having an insulating surface, and circuits including transistors are formed using the single-crystalline semiconductor layers, so that display devices are manufactured.

A single-crystalline semiconductor layer separated from a single-crystalline semiconductor substrate is applied to the single-crystalline semiconductor layers. A polycrystalline semiconductor substrate may be applied instead of the single-crystalline semiconductor substrate. The single-crystalline semiconductor layer is divided into sections each having a size corresponding to one display panel (a panel size), specifically, sections each having an area including one panel, and the sections of the single-crystalline semiconductor layer are bonded to a substrate having an insulating surface.

In the case where a plurality of single-crystalline semiconductor layers are transferred from a single-crystalline semiconductor substrate, a plurality of single-crystalline semiconductor layers may belong to one alignment marker.

An aspect of the present invention is a method for manufacturing a display device, including the steps of bonding a plurality of single-crystalline semiconductor layers obtained by dividing a semiconductor substrate into sections each having an area including one panel to a substrate having an insulating surface with an insulating layer interposed therebetween, and forming a circuit including a transistor using each of the single-crystalline semiconductor layers by exposing a block selected from the plurality of single-crystalline semiconductor layers at a time and transferring and forming a circuit pattern.

Another aspect of the present invention is a method for manufacturing a display device, including the steps of bonding a plurality of single-crystalline semiconductor layers obtained by dividing a semiconductor substrate into sections each having an area including one panel to a substrate having an insulating surface, with a silicon oxide layer interposed therebetween which is formed by a chemical vapor deposition method using organic silane as a source gas; and forming a circuit including a transistor using each of the single-crystalline semiconductor layers by exposing a block selected from the plurality of single-crystalline semiconductor layers at a time and transferring and forming a circuit pattern.

Another aspect of the present invention is that one block selected from the plurality of single-crystalline semiconductor layers may be a block in a range that can be exposed to light one time using a light exposure apparatus, i.e. a range that is exposed to light one time using the light exposure apparatus. Further, a plurality of single-crystalline semiconductor layers may belong to one alignment marker in the one block.

Another aspect of the present invention is a display device including a circuit including a transistor over a substrate having an insulating surface. The transistor includes a channel formation region including a single-crystalline semiconductor. A silicon oxide layer formed by a chemical vapor deposition method using organic silane as a source gas is provided between the channel formation region of the transistor and the substrate having an insulating surface.

Another aspect of the present invention is that tetraethoxysilane, trimethylsilane, tetramethylsilane, tetramethylcyclotetrasiloxane, octamethylcyclotetrasiloxane, hexamethyldisilazane, triethoxysilane, or trisdimethylaminosilane can be used as the organic silane.

Another aspect of the present invention is that aluminosilicate glass, aluminoborosilicate glass, barium borosilicate glass, a quartz substrate, a sapphire substrate, or a ceramic substrate can be used as the substrate having an insulating surface.

In this description, a display device designates a device in which a display element (e.g. a liquid crystal element, a light-emitting element, or an electrophoretic element) is used; i.e., an image display device. Further, examples of the display device include all of the followings: a module in which an external input terminal such as a flexible printed circuit (FPC), tape automated bonding (TAB) tape, or tape carrier package (TCP) is attached to a display panel (e.g. a liquid crystal panel or a light-emitting panel); a module in which a printed wiring board is provided at an end of TAB tape or TCP; and a module in which an IC (integrated circuit) or a CPU (central processing unit) is mounted directly on a display panel by a COG (chip on glass) method.

Application of the present invention enables achievement of an SOI substrate with a large area and improvement in the productivity of manufacturing display devices utilizing the SOI substrate. Further, high performance can be achieved in the display devices utilizing the SOI substrate.

BRIEF DESCRIPTION OF DRAWINGS

In the accompanying drawings:

FIGS. 11A to 11D are cross-sectional views showing an example of a method for manufacturing a display device according to the present invention;

FIGS. 12A to 12C are cross-sectional views showing an example of a method for manufacturing a display device according to the present invention;

FIGS. 13A and 13B are cross-sectional views showing an example of a method for manufacturing a display device according to the present invention;

FIGS. 14A and 14B are cross-sectional views showing an example of a method for manufacturing a display device according to the present invention;

BEST MODE FOR CARRYING OUT THE INVENTION

Embodiment Modes

Figure 1A:
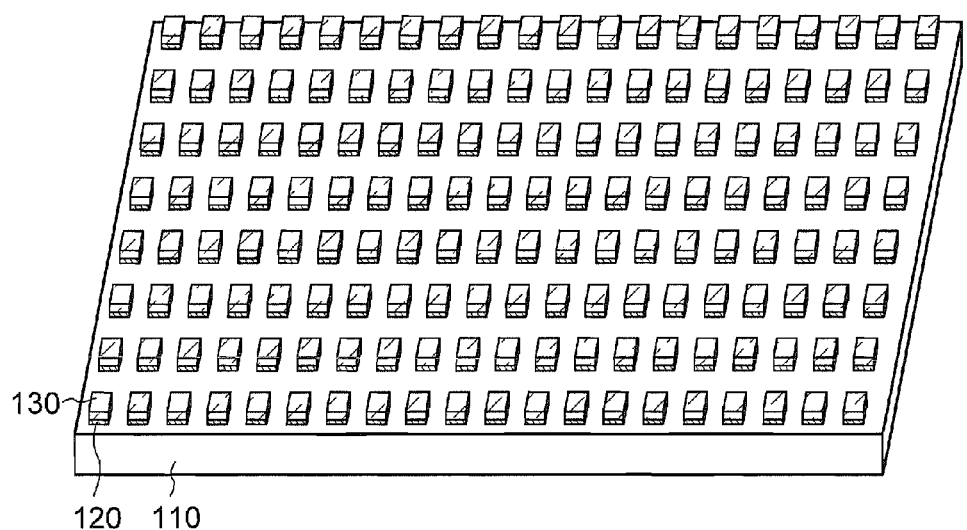
FIGS. 1A and 1B are perspective views showing examples of structures of an SOI substrate according to the present invention.

Hereinafter, embodiment modes of the present invention are described in detail with reference to the drawings. Note that the present invention is not limited to the following description, and it is easily understood by those skilled in the art that the modes and details disclosed herein can be modified in various ways without departing from the spirit and scope of the present invention. Therefore, the present invention should not be interpreted as being limited to the description of the embodiment modes to be given below. In the structures of the present invention to be described hereinafter, a reference numeral which designates the same parts is used in different drawings in some cases.

Embodiment Mode 1

An SOI substrate according to this embodiment mode is formed by transferring single-crystalline semiconductor layers from a single-crystalline semiconductor substrate to a substrate of a different type (hereinafter, also referred to as a "base substrate"). Hereinafter, an SOI substrate according to this embodiment mode and an embodiment mode of a method for manufacturing the SOI substrate are described.

Figure 1B:
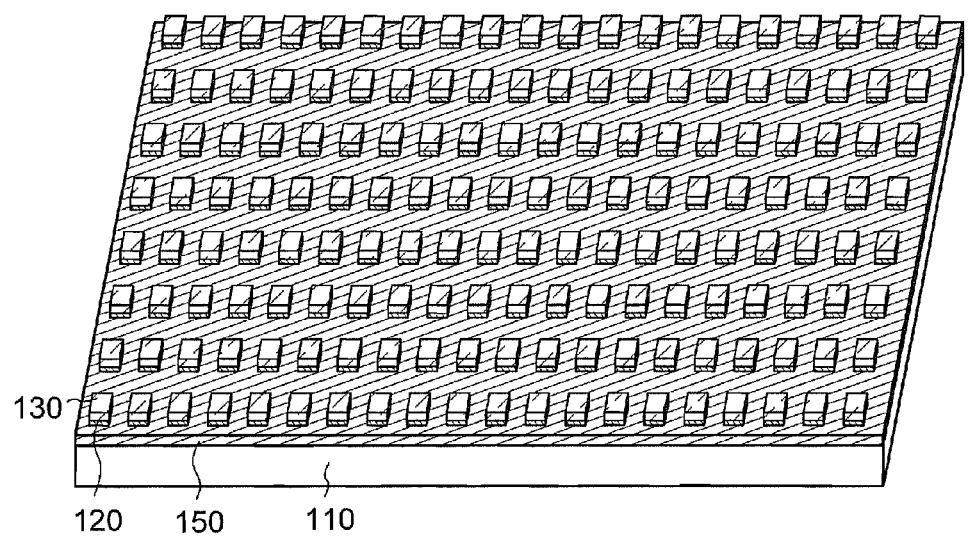

FIGS. 1A and 1B show perspective views showing structural examples of an SOI substrate according to the present invention. Further, FIGS. 2A to 3B show cross-sectional views of examples of an SOI substrate according to the present invention.

Figure 2A:
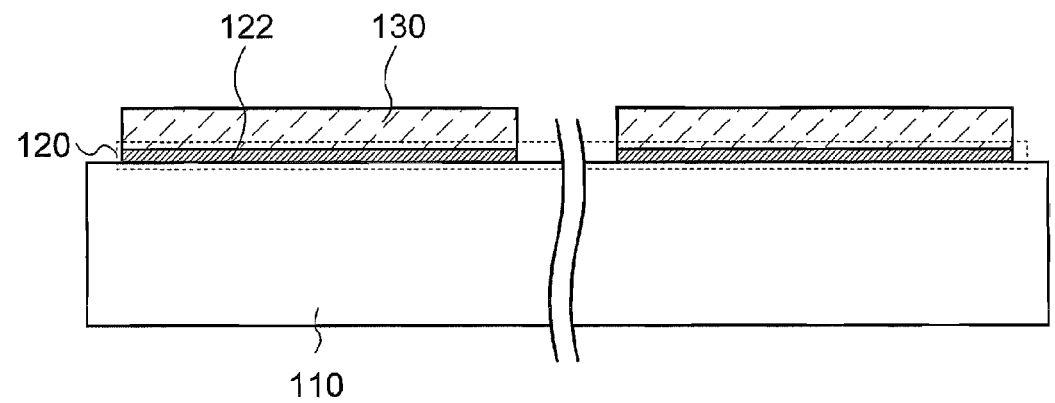
FIGS. 2A and 2B are cross-sectional views showing examples of structures of an SOI substrate according to the present invention.
Figure 2B:
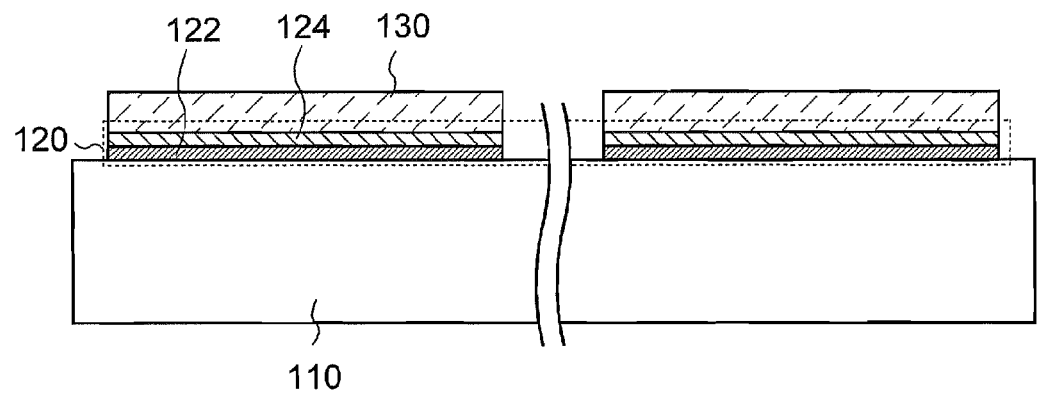

In FIGS. 1A, 2A, and 2B, an SOI substrate 100 has a structure in which a plurality of layered bodies in which an insulating layer 120 and a single-crystalline semiconductor layer (hereinafter, also referred to as an SOI layer) 130 are stacked in this order are provided over a surface of a base substrate 110. The SOI layer 130 is provided over the base substrate 110 with the insulating layer 120 interposed therebetween, and constitutes what is called an "SOI structure". That is, a plurality of SOI layers 130 are provided over one base substrate 110, and constitute one SOI substrate 100. FIGS. 2A and 2B show examples in which two SOI layers 130 are provided over one base substrate 110 for the sake of convenience.

The SOI layer 130 is a single-crystalline semiconductor, and single-crystalline silicon is typically applied thereto. Alternatively, a crystalline semiconductor layer of silicon, germanium, a compound semiconductor such as gallium arsenide or indium phosphide, or the like, which can be separated from a single-crystalline semiconductor substrate or a polycrystalline semiconductor substrate by a hydrogen ion implanting separation method, can also be applied.

A feature of an SOI substrate according to the present invention is that a size of the SOI layer 130 that constitutes the SOI substrate is a desired panel size. The SOI layer 130 is divided into sections each having an area including one panel, which is the desired panel size. In this specification, a "panel size" designates a size of a peripheral frame portion (non-display portion) of a display panel in addition to a display portion. Further, a "size" designates an area. In an SOI substrate according to the present invention, the plurality of SOI layers 130 obtained by dividing a semiconductor substrate into sections each having an area including one panel, which is the desired panel size, are bonded to the base substrate 110 with the insulating layers 120 interposed therebetween.

The panel size may be appropriately determined depending on the usage, and for example, a small to medium panel size of a diagonal line of 10 in. or less can be employed. With respect to a mobile phone, which has a small to medium panel, known sizes (screen sizes) of a display portion are diagonal lines of 2.2 in. (56 mm), 2.4 in. (61 mm), and 2.6 in. (66 mm), for example; when a mobile phone has the above panel size, the panel size may be determined in consideration of a size of a frame portion (screen frame size) around a display portion in addition to a screen size.

Although the shape of the SOI layer 130 is not particularly limited, a rectangular shape (including a square), which enables easier processing and bonding of the SOI layer 130 to the base substrate 110 with a high integration degree, is preferable. When the SOI layer 130 is used for a panel of a display device, it is preferable that the SOI layer 130 have an aspect ratio of 4:3. By making the SOI layer 130 have a desired area including one panel, i.e., a size which is about equal to a desired panel size, it is possible to control a yield on a panel-to-panel basis in manufacturing a variety of display devices by incorporating a display panel manufactured using an SOI substrate completed. Further, damage to elements can be prevented in dividing a panel from each other. Therefore, a yield can be improved. By making the SOI layer 130 have a desired area including one panel, i.e., a size which is about equal to a desired panel size, the element of each panel can be formed using one SOI layer, and thus variation in characteristics can be suppressed.

A substrate having an insulating surface or an insulating substrate is used for the base substrate 110. Concretely, a variety of glass substrates used for electronic industries (e.g. aluminosilicate glass, aluminoborosilicate glass, or barium borosilicate glass), a quartz substrate, a ceramic substrate, or a sapphire substrate can be given as an example. It is preferable to use a glass substrate for the base substrate 110: for example, a large-sized mother glass called "the sixth generation" (1500 mm×1850 mm), "the seventh generation" (1870 mm×2200 mm), or the "eighth generation" (2200 mm×2400 mm) is used. By using a large-sized mother glass for the base substrate 110 and manufacturing an SOI substrate with application of the present invention, the SOI substrate can have a large area. In the SOI substrate formed by bonding a plurality of SOI layers obtained by dividing a semiconductor substrate into sections each having an area including one panel, specifically, a desired panel size, to a base substrate having an insulating surface, with an insulating layer interposed therebetween, each SOI layer has a desired panel size; thus, the number of display panels that can be manufactured using one base substrate can be increased. Therefore, productivity of end products (display devices) manufactured with the display device incorporated therein can be improved.

The insulating layer 120 is provided between the base substrate 110 and the SOI layer 130. The insulating layer 120 may have a single-layer structure or a stacked-layer structure. A surface bonded to the base substrate 110 (hereinafter, also referred to as a "bonding surface") is smooth and hydrophilic. In this description, hereinafter, a layer formed on a bonding surface is also referred to as a "bonding layer." FIG. 2A shows an example in which a bonding layer 122 is formed as the insulating layer 120. A silicon oxide layer is suitable for the bonding layer 122 that has a smooth surface and can form a hydrophilic surface. In particular, a silicon oxide layer which is made by a chemical vapor deposition method using organic silane as a source gas is preferable. As the organic silane, a compound containing silicon such as tetraethoxysilane (abbr.: TEOS; chemical formula: $Si(OC_2H_5)_4$), tetramethylsilane (abbr.: TMS; chemical formula: $Si(CH_3)_4$), trimethylsilane (chemical formula: $(CH_3)_3SiH$), tetramethylcyclotetrasiloxane (abbr.: TMCTS), octamethylcyclotetrasiloxane (abbr.: OMCTS), hexamethyldisilazane (abbr.: HMDS), triethoxysilane (chemical formula: $SiH(OC_2H_5)_3$), or trisdimethylaminosilane (chemical formula: $SiH(N(CH_3)_2)_3$) can be used.

It is preferable that the bonding layer 122 that has a smooth surface and forms a hydrophilic surface have a thickness of 5 to 500 nm inclusive. By making the bonding layer 122 have a thickness within the above range, it is possible to smooth a rough film formation surface and ensure smoothness of a developing surface of the bonding layer 122. Further, a distortion between the bonding layer 122 and a substrate bonded thereto (in FIG. 2A, the base substrate 110) can be relieved. A silicon oxide layer similar to the bonding layer 122 may further be provided for the base substrate 110. With respect to the SOI substrate according to the present invention, in bonding the SOI layer 130 to the base substrate 110, which is a substrate having an insulating surface or an insulating substrate, a bonding layer formed preferably of a silicon oxide layer formed using organic silane as a source gas is provided for either or both of the surfaces on which bonding is formed, whereby firm bonding can be formed.

FIG. 2B shows an example in which the insulating layer 120 has a stacked-layer structure: concretely, an example in which a stacked-layer structure including the bonding layer 122 and an insulating layer 124 containing nitrogen is formed as the insulating layer 120 is shown. The insulating layer 124 containing nitrogen is provided between the SOI layer 130 and the bonding layer 122 in order that the bonding layer 122 is formed on a bonding surface of the base substrate 110. The insulating layer 124 containing nitrogen is formed using a silicon nitride layer, a silicon nitride oxide layer, or a silicon oxynitride layer to have a single-layer structure or a stacked-layer structure. For example, the insulating layer 124 containing nitrogen can be formed by stacking a silicon oxynitride layer and then a silicon nitride oxide layer from the SOI layer 130 side. The bonding layer 122 is provided in order to form bonding with the base substrate 110. The insulating layer 124 containing nitrogen is preferably provided in order to prevent impurities such as movable ions or moisture from diffusing into the SOI layer 130 and thus contaminating the SOI layer 130.

Note that a silicon oxynitride layer means a film that contains more oxygen than nitrogen, and in the case where measurements are performed using Rutherford backscattering spectrometry (RBS) and hydrogen forward scattering (HFS), contains oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide layer means a film that contains more nitrogen than oxygen, and in the case where measurements are performed using RBS and HFS, contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride layer or the silicon nitride oxide layer is defined as 100 at. %.

Figure 3A:
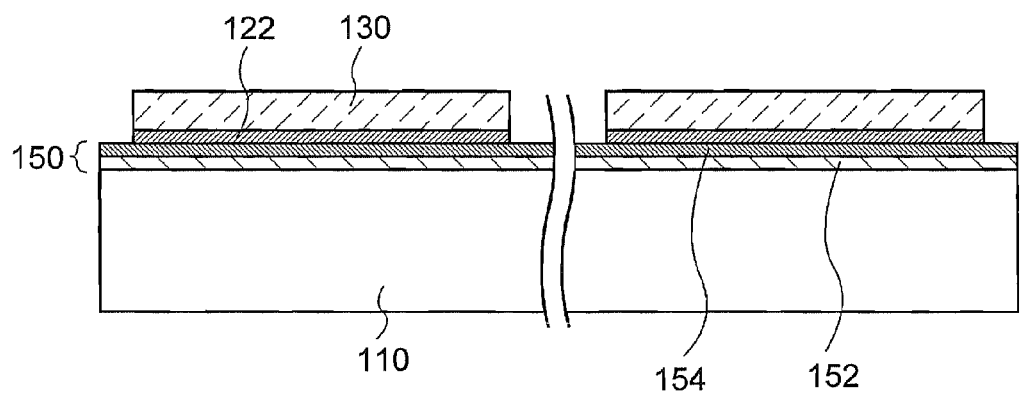
FIGS. 3A and 3B are cross-sectional views showing examples of structures of an SOI substrate according to the present invention.
Figure 3B:
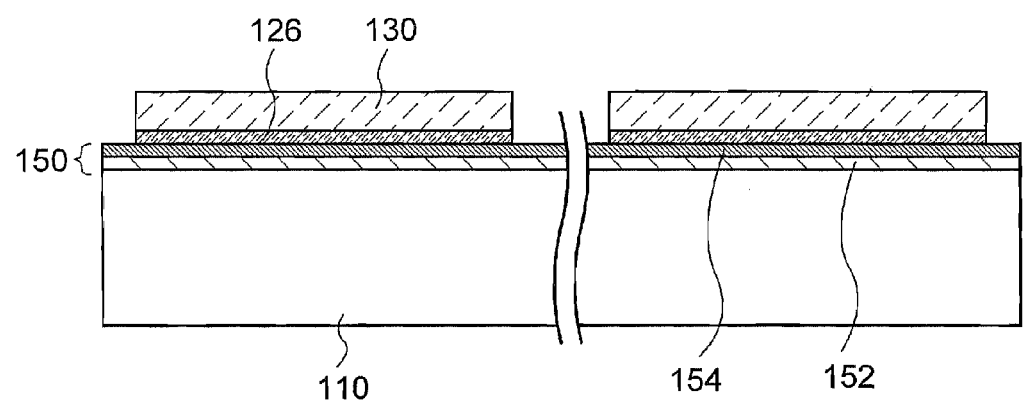

FIGS. 1B, 3A, and 3B show examples in which an insulating layer 150 including a bonding layer is provided for the base substrate 110. The insulating layer 150 may have a single-layer structure or a stacked-layer structure. A surface bonded to the SOI layer 130 is smooth and hydrophilic. It is preferable to provide a barrier layer between the base substrate 110 and the bonding layer in order to prevent movable ions of an alkali metal, an alkaline earth metal, or the like from diffusing from the glass substrate used as the base substrate 110.

FIG. 3A shows an example in which a stacked-layer structure including a barrier layer 152 and a bonding layer 154 is formed as the insulating layer 150. As the bonding layer 154, a silicon oxide layer similar to the bonding layer 122 may be provided. Further, a bonding layer may be provided for the SOI layer 130 as appropriate. FIG. 3A shows an example in which the bonding layer 122 is provided for the SOI layer 130 as well. Such a structure can achieve firmer bonding because the bonding layers form the bonding in bonding the SOI layer 130 to the base substrate 110. The barrier layer 152 is formed using a silicon oxide layer, a silicon nitride layer, a silicon oxynitride layer, or a silicon nitride oxide layer to have a single-layer structure or a stacked-layer structure. Preferably, the barrier layer 152 is formed using an insulating layer containing nitrogen.

FIG. 3B shows an example in which a bonding layer is provided for the base substrate 110: concretely, an example in which a stacked-layer structure including the barrier layer 152 and the bonding layer 154 is provided as the insulating layer 150 on the base substrate 110. Further, a silicon oxide layer 126 is provided for the SOI layer 130. In bonding the SOI layer 130 to the base substrate 110, the silicon oxide layer 126 forms bonding with the bonding layer 154. It is preferable to form the silicon oxide layer 126 by a thermal oxidation method. It is also possible to use a chemical oxide as the silicon oxide layer 126. A chemical oxide can be formed by, for example, processing a surface of a semiconductor substrate with water containing ozone. A chemical oxide is preferable because it is formed reflecting planarity of a surface of a semiconductor substrate.

Next, a method for manufacturing an SOI substrate according to the present invention is described. Here, an example of a method for manufacturing the SOI substrate shown in FIG. 2A is described with reference to FIGS. 4A to 6C.

Figure 4A:
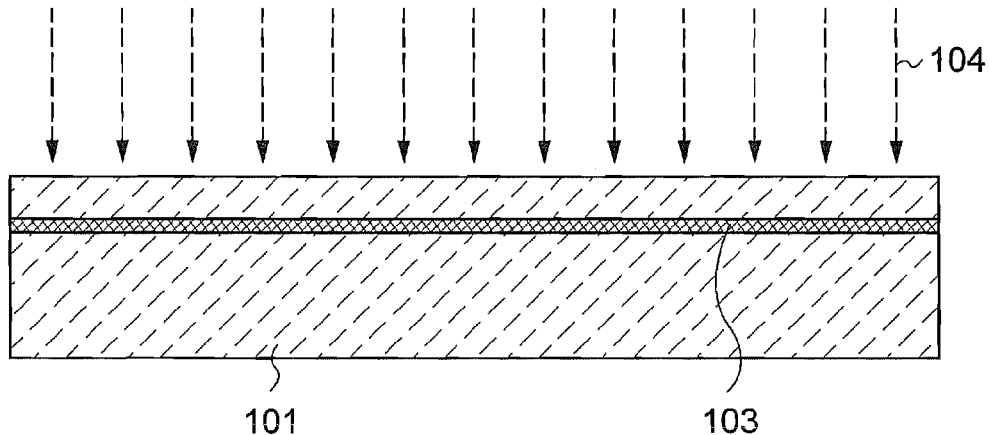
FIGS. 4A to 4C are cross-sectional views showing an example of a method for manufacturing an SOI substrate according to the present invention.
Figure 6A:
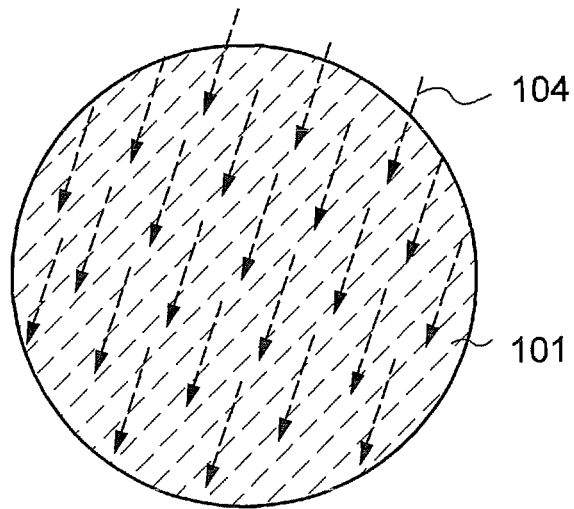
FIGS. 6A to 6C are top views showing an example of a method for manufacturing an SOI substrate according to the present invention.

First, a semiconductor substrate 101 is prepared (see FIGS. 4A and 6A). As the semiconductor substrate 101, a commercial semiconductor substrate such as a single-crystalline semiconductor substrate or a polycrystalline semiconductor substrate may be used: concretely, a semiconductor substrate (e.g. a silicon substrate or a germanium substrate) or a compound semiconductor (e.g. gallium arsenide or indium phosphide) substrate can be used. Typical sizes of the commercial silicon substrate are 5 in. (125 mm), 6 in. (150 mm), 8 in. (200 mm), and 12 in. (300 mm) in diameter, and most of the commercial silicon substrates are circular. Further, the film thickness can be determined up to about 1.5 mm as appropriate.

Next, ions 104 accelerated by an electric field are implanted from a surface of the semiconductor substrate 101, so that an ion-doped layer 103 is formed in a region at a given depth (see FIGS. 4A and 6A). Note that in this description, ion implantation means that a semiconductor substrate is irradiated with accelerated ions, so that an element that forms the ions for the irradiation is contained in a semiconductor substrate. Further, an ion-doped layer means a region that is weakened to have minute cavities by irradiating a semiconductor substrate with ions, and is referred to as a "separation layer," hereinafter. The semiconductor substrate is divided at the separation layer with later heat treatment, so that an SOI layer can be formed over a base substrate. Irradiation with the ions 104 is performed in consideration of the thickness of an SOI layer that is transferred to a base substrate later. It is preferable that the SOI layer have a thickness of 5 to 500 nm inclusive, more preferably, 10 to 200 nm inclusive. The acceleration voltage and the dose of the ions in the ion irradiation are determined as appropriate in consideration of the thickness of the SOI layer to be transferred. As the ions 104, ions of hydrogen, helium, or halogen such as fluorine can be used. As the ion 104, it is preferable to use an ion species including an atom or a plurality of the same atoms formed by exciting a source gas selected from hydrogen, helium, and a halogen element with plasma. In the case where hydrogen is implanted, it is preferable that $H^+$, $H_2^+$, and $H_3^+$ ions be contained and the $H_3^+$ ion be contained at a higher percentage. Thus, efficiency of the ion irradiation can be enhanced and time of the ion irradiation can be shortened. Further, such a structure enables easy separation.

In order to form the separation layer 103 at a given depth, irradiation with the ions 104 needs to be performed at a high dose rate in some cases. In this case, the surface of the semiconductor substrate 101 becomes rough depending on conditions. Therefore, a silicon nitride layer, a silicon nitride oxide layer, or the like with a thickness of 50 to 200 nm inclusive may be provided as a protective layer for the surface of the semiconductor substrate, to which the ion is applied.

Figure 4B:
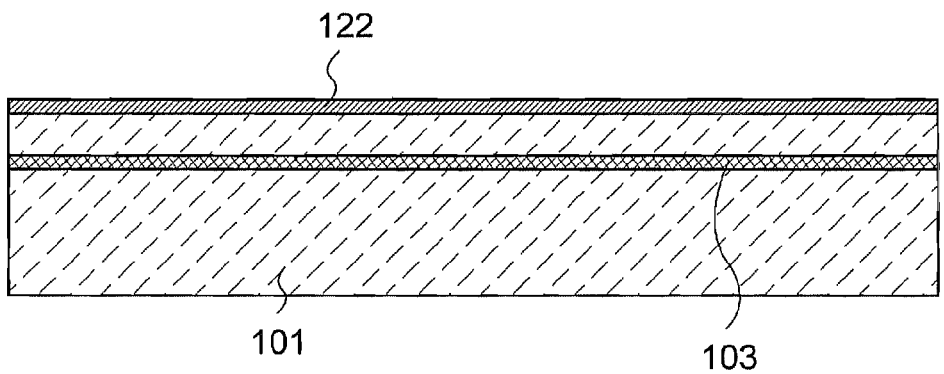
Figure 4C:
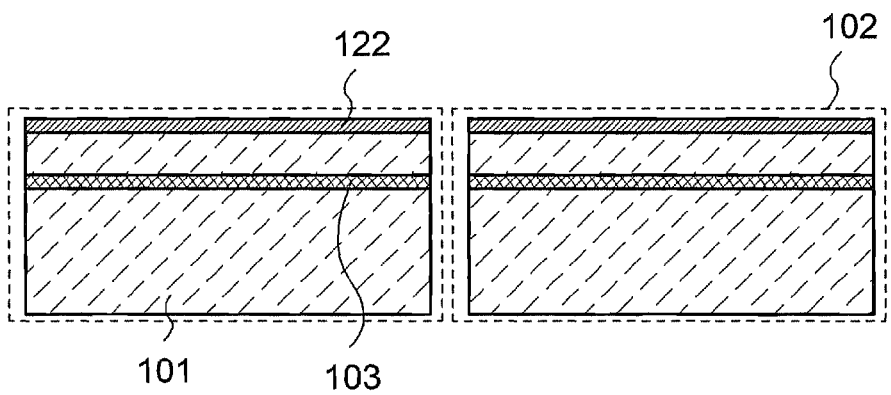
Figure 6B:
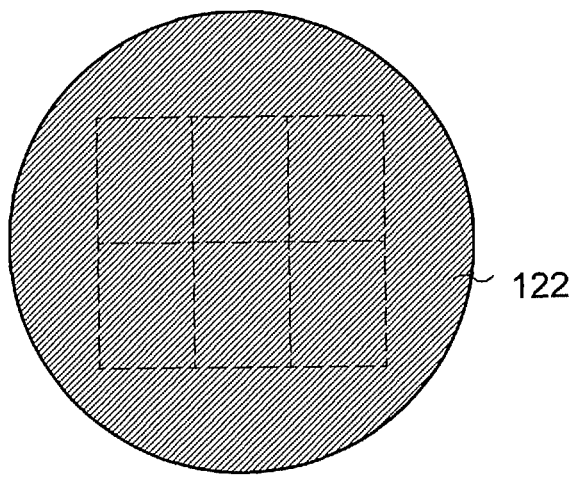

Next, the bonding layer 122 is formed on the semiconductor substrate 101 (see FIGS. 4B and 6B). The bonding layer 122 is formed on the surface of the semiconductor substrate 101, which forms bonding with the base substrate. As the bonding layer 122 formed here, a silicon oxide layer formed by a chemical vapor deposition method using organic silane as a source gas as described above is preferable. It is also possible to use a silicon oxide layer formed by a chemical vapor deposition method using silane as a source gas. Temperatures at which degasification from the separation layer 103 formed in the semiconductor substrate 101 does not occur are applied to forming a film by a chemical vapor deposition method. For example, a film formation temperature of 350° C. or lower is applied. A heat treatment temperature higher than the film formation temperature by a chemical vapor deposition method is applied to heat treatment for separating the SOI layer from the semiconductor substrate such as a single-crystalline semiconductor substrate or a polycrystalline semiconductor substrate.

Figure 6C:
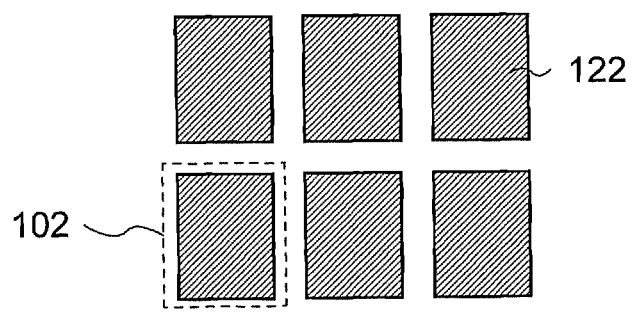

Next, the semiconductor substrate 101 is processed to have a desired size and shape (see FIGS. 4C and 6C): concretely, the semiconductor substrate 101 is processed to have a desired panel size. FIG. 6C shows an example in which the semiconductor substrate 101 of a circular shape is divided into sections to form semiconductor substrates 102 of a rectangular shape. At this time, the bonding layer 122 and the separation layer 103 are also divided. That is, the semiconductor substrates 102 which each have a desired panel size, include a separation layer 103 at a given depth, and have the bonding layer 122 formed on the surface (the surface to which the base substrate is bonded) are obtained.

It is preferable that the semiconductor substrate 102 have a panel size of a variety of display devices. The panel size may be determined as appropriate according to an end product into which the panel is incorporated, or the like: for example, the panel size may be a diagonal line of less than 10 in., which is a panel size of a small to medium panel. For example, in the case where the semiconductor substrate 102 is applied to a mobile phone with a screen size of 2.4 in. in diagonal line, the panel size is determined in consideration of a screen frame size in addition to a screen size of 2.4 in. in diagonal line. The shape of the semiconductor substrate 102 may be determined as appropriate according to the usage of an end product or the like. In the case where the semiconductor substrate 102 is applied to a display device, it is preferable that the semiconductor substrate 102 have a rectangular shape with an aspect ratio of about 3:4. Further, it is preferable that the semiconductor substrate 102 have a rectangular shape. Thus, processing in later manufacturing steps is easy and the semiconductor substrate 102 can be cut from the semiconductor substrate 101 efficiently. The semiconductor substrate 101 can be divided with a cutting apparatus such as a dicer or a wiresaw, a laser, plasma, an electronic beam, or any other cutting means.

An order of steps up to provision of the bonding layer on the surface of the semiconductor substrate can be permuted as appropriate. FIGS. 4A to 4C and 6A to 6C show an example in which the separation layer is formed in the semiconductor substrate, the bonding layer is provided on the surface of the semiconductor substrate, and then the semiconductor substrate is processed to have a desired panel size each. However, the following method can also be taken, for example: after processing the semiconductor substrate so as to have a desired panel size, the separation layer is formed in the semiconductor substrate having the desired panel size, and the bonding layer is provided for the surface of the semiconductor substrate having the desired panel size.

Figure 5A:
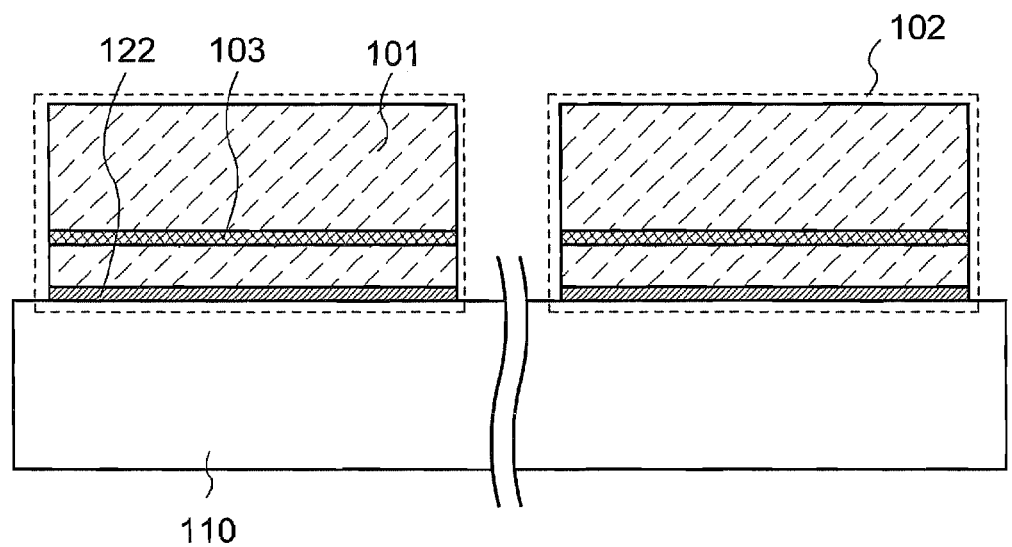
FIGS. 5A and 5B are cross-sectional views showing an example of a method for manufacturing an SOI substrate according to the present invention.

Next, the base substrate 110 and the semiconductor substrate 102 are bonded to each other. FIG. 5A shows an example in which the surface of the semiconductor substrate 102, for which the bonding layer 122 is provided is brought into close contact with the base substrate 110, and the base substrate 110 and the bonding layer 122 are bonded to each other, so that the base substrate 110 and the semiconductor substrate 102 are bonded to each other. Note that it is preferable that the surface which forms bonding (bonding surface) be cleaned sufficiently. Close contact between the base substrate 110 and the bonding layer 122 forms the bonding. Van der Waals force acts on this bonding, and the base substrate 110 and the semiconductor substrate 102 are bonded to each other by being pressed, so that the firm bonding due to a hydrogen bond can be formed.

The bonding surface may be activated in order to form favorable bonding between the base substrate 110 and the bonding layer 122. For example, one or both of the surfaces on which the bonding is formed is irradiated with an atomic beam or an ion beam. In the case where an atomic beam or an ion beam is utilized, an inert gas (e.g. argon) neutral atom beam or an inert gas ion beam can be used. It is also possible to activate the bonding surface by plasma irradiation or radical treatment. Such surface treatment facilitates forming bonding between different materials even at a temperature of 400° C. or lower.

After bonding the semiconductor substrate 102 to the base substrate 110 with the bonding layer 122 interposed therebetween, it is preferable to perform heat treatment or pressure treatment. The heat treatment or the pressure treatment can improve a bonding strength. It is preferable that a process temperature of the heat treatment be lower than or equal to the heat-resistant temperature of the base substrate 110. The pressure treatment is performed so that pressure is applied to the bonding surface in a perpendicular direction, in consideration of the pressure resistance of the base substrate 110 and the semiconductor substrate 102.

Figure 5B:
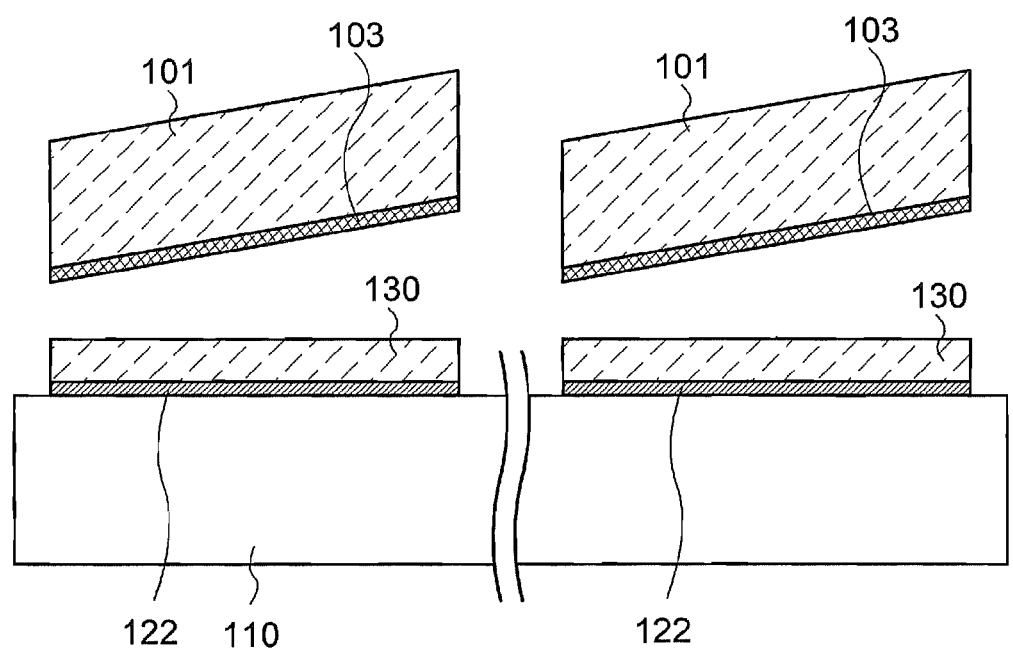

Next, heat treatment is performed, so that part of the semiconductor substrate 102 is separated from the base substrate 110, the separation layer 103 functioning as a cleavage plane (see FIG. 5B). It is preferable that the process temperature of the heat treatment be higher than or equal to the film formation temperature of the bonding layer 122 and lower than or equal to the heat-resistant temperature of the base substrate 110. For example, heat treatment is performed at process temperatures of 400 to 600° C. inclusive, whereby there occurs a change in volume of a minute cavity formed in the separation layer 103 and thus separation along the separation layer 103 is possible. The SOI layer 130, which has the same crystallinity as that of the semiconductor substrate 102, is left over the base substrate 110 because the bonding layer 122 is bonded to the base substrate 110. Note that in this description, "cleavage" means that part of a semiconductor substrate is separated at a separation layer which is weakened to have minute cavities by performing irradiation with ions of hydrogen, helium, or halogen such as fluorine, so that an SOI layer is formed over a base substrate. Further, the "cleavage plane" designates a separation plane (a plane opposite to the base substrate) of the SOI layer provided over the base substrate by the separation.

Figure 8A:
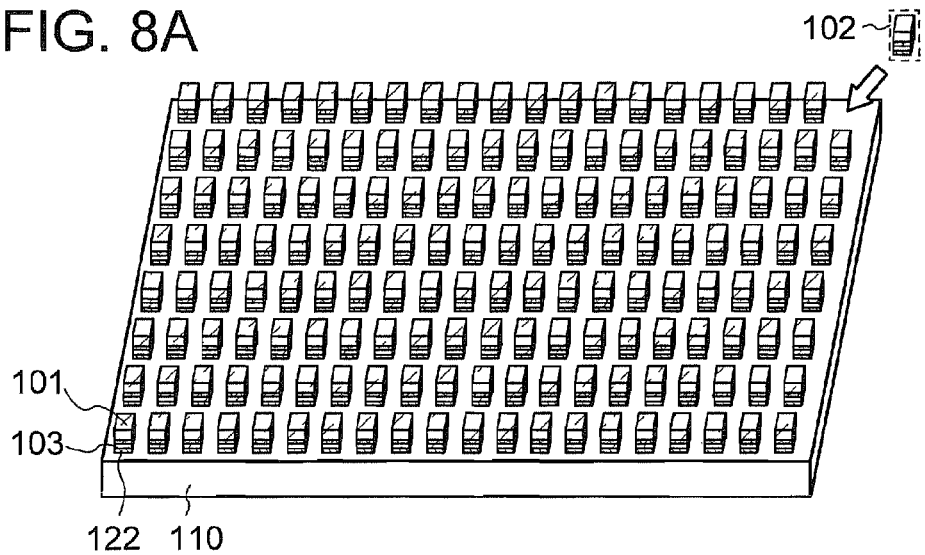
FIGS. 8A and 8B are perspective views showing an example of a method for manufacturing an SOI substrate according to the present invention.
Figure 8B:
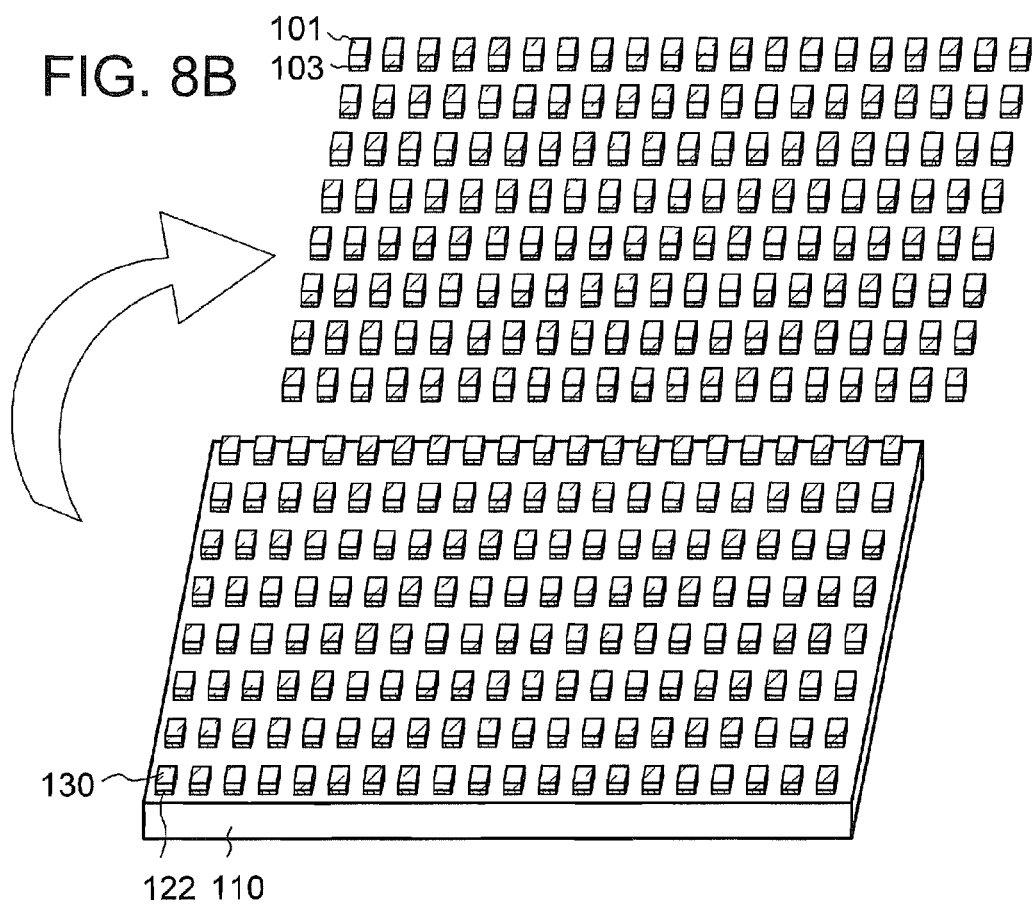

In the above manner, the SOI structure in which the SOI layer 130 is provided over the base substrate 110 with the bonding layer 122 interposed therebetween is formed. Note that the SOI substrate according to the present invention has a feature that a plurality of SOI layers are provided over one base substrate with a bonding layer interposed therebetween. For example, a separation layer is formed, a bonding layer is formed at a surface, and the desired number of semiconductor substrates 102 formed by being processed into sections each having a desired panel size are prepared. Then, after bonding the desired number of semiconductor substrates 102 to the base substrate 110 as shown in FIG. 8A, separation is performed at one time by heat treatment as shown in FIG. 8B, so that an SOI substrate can be manufactured. Instead of performing the separation at one time by heat treatment, it is also possible to repeat the steps of bonding one or some semiconductor substrates 102 to the base substrate 110 and separating part of the semiconductor substrates 102 to manufacture an SOI substrate.

It is preferable to arrange the semiconductor substrates 102 systematically over the base substrate 110 because such an arrangement makes later steps easy. For example, the use of a control system such as a CCD camera or a computer enables systematic arrangement and bonding of the semiconductor substrates 102. Alternatively, a marker or the like may be formed on the base substrate 110 or the semiconductor substrates 102 to adjust the positions. Although FIGS. 8A and 8B show a structure in which adjacent SOI layers have some space therebetween, the SOI layers may be laid with as small space as possible.

It is preferable that SOI layers obtained by separation be subjected to chemical mechanical polishing (CMP) in order to planarize the surfaces. Alternatively, the planarization may be performed by irradiating the surfaces of the SOI layers with a laser beam instead of using a physical polishing means such as CMP. The laser beam irradiation is preferably performed in a nitrogen atmosphere containing oxygen at a concentration of 10 ppm or less. The reason is that the surfaces of the SOI layers can be rough when laser beam irradiation is performed in an oxygen atmosphere. Further, CMP or the like may be performed to thin SOI layers obtained.

Figure 7A:
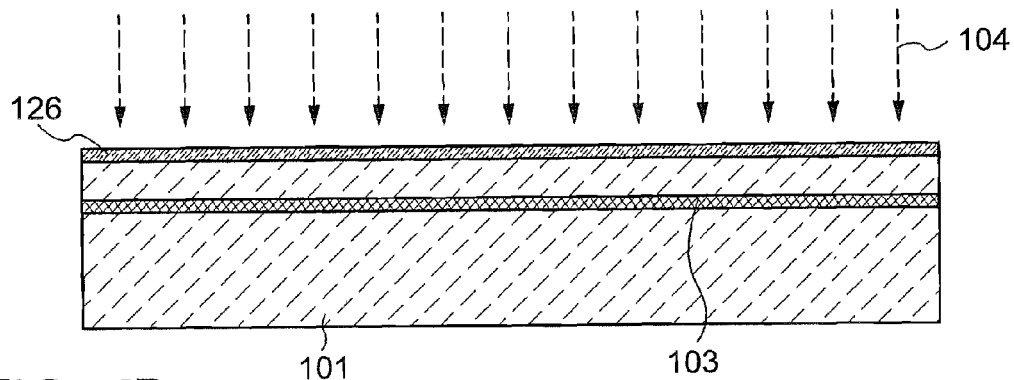
FIGS. 7A to 7C are cross-sectional views showing an example of a method for manufacturing an SOI substrate according to the present invention.
Figure 7B:
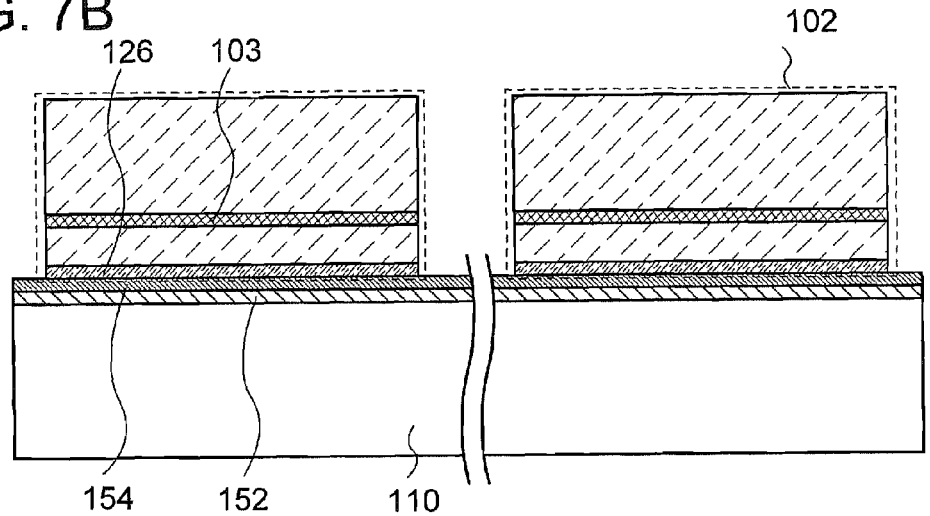
Figure 7C:
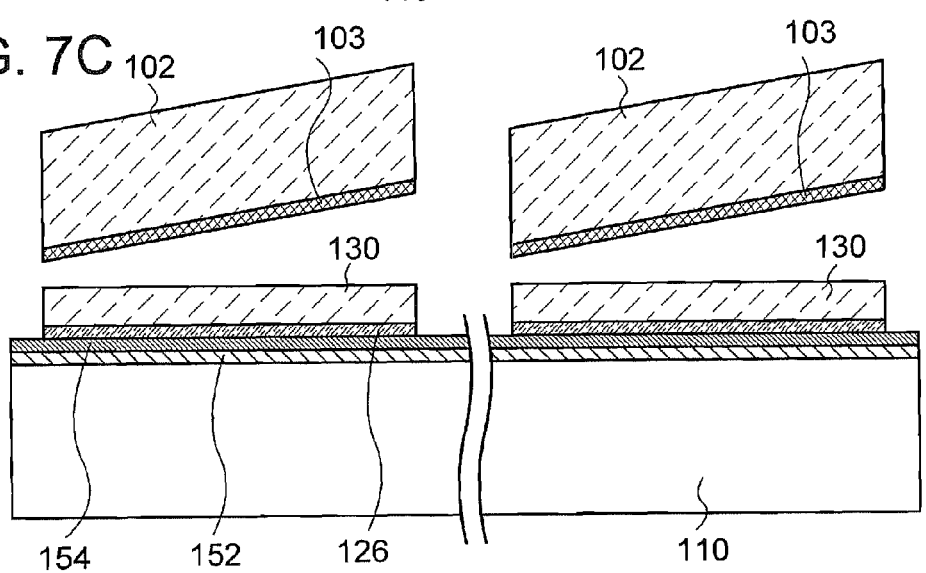

FIGS. 7A to 7C show a step of providing a bonding layer on a base substrate side and to form SOI layers. Here, an example of a method for manufacturing the SOI substrate shown in FIG. 3B is described.

FIG. 7A shows a step of irradiating the semiconductor substrate 101 having the silicon oxide layer 126 with the ions 104 accelerated by an electric field to form the separation layer 103 at a given depth. The silicon oxide layer 126 can be formed by a CVD method or a sputtering method, preferably by a thermal oxidation method. As the silicon oxide layer 126, it is also possible to use a chemical oxide formed by treating the surface of the semiconductor substrate with water containing ozone or the like. A semiconductor substrate similar to the semiconductor substrate 101 in FIG. 4A can be used for the semiconductor substrate 101 in FIG. 7A. Further, the irradiation with ions of hydrogen, helium, or halogen such as fluorine is performed in a similar manner to that shown in FIG. 4A. With formation of the silicon oxide layer 126 on the surface of the semiconductor substrate 101, loss of planarity due to damage to the surface of the semiconductor substrate in the ion irradiation can be prevented.

FIG. 7B shows a step of bringing the surface of the semiconductor substrate 102, on which the silicon oxide layer 126, is formed into close contact with the base substrate 110 on which the barrier layer 152 and the bonding layer 154 are formed, thereby forming bonding. The bonding is formed by bringing the silicon oxide layer 126 on the semiconductor substrate 102 into close contact with the bonding layer 154 over the base substrate 110. The semiconductor substrate 102 is obtained by processing the semiconductor substrate 101, in which the separation layer 103 is formed and the silicon oxide layer 126 is formed at the surface, into sections each having a desired panel size. The barrier layer 152 may be formed by a CVD method or a sputtering method using a silicon oxide layer, a silicon nitride layer, a silicon oxynitride layer, or a silicon nitride oxide layer to have a single-layer structure or a stacked-layer structure. As the bonding layer 154, a silicon oxide layer similar to the bonding layer 122 may be formed.

Then, as shown in FIG. 7C, part of the semiconductor substrate 102 is separated. Heat treatment for the separation is performed in a similar manner to that shown in FIG. 5B: the part of the semiconductor substrate 102 is separated from the base substrate 110, the separation layer 103 functioning as a cleavage plane. After the separation, there remains the SOI layer 130 having the same crystallinity as that of the semiconductor substrate 102 over the base substrate 110, so that the SOI substrate as shown in FIG. 1B can be obtained. The SOI substrate shown in FIG. 7C has a structure in which the SOI layer 130 is provided over the base substrate 110 with the barrier layer 152, the bonding layer 154, and the silicon oxide layer 126 interposed therebetween. After the separation, CMP, laser beam irradiation, or the like may be performed to planarize or thin the obtained SOI layer.

With application of a manufacturing method of an SOI substrate according to the present invention, the SOI layer 130 having a bonding portion with a high bond strength can be obtained even if the base substrate 110 has a heat-resistant temperature of 600° C. or lower (e.g. a glass substrate). Further, a variety of glass substrates for electronic industry which are called "alkali-free glass" such as aluminosilicate glass, aluminoborosilicate glass, or barium borosilicate glass can be used as the base substrate 110 because a process temperature of 600° C. or lower can be applied. Needless to say, it is also possible to use a ceramic substrate, a sapphire substrate, a quartz substrate, or the like. That is, single-crystalline semiconductor layers can be formed over a substrate with a side more than 1 meter long. With the use of such a large-sized substrate, a display device (e.g. a liquid crystal display device) or a semiconductor integrated circuit can be manufactured.

An SOI substrate according to the present invention has a structure in which panel-sized SOI layers are provided over a base substrate. Such a structure enables formation of desired display panels using one SOI layer, and can achieve improvement in a yield. Further, desired display panels can be formed using one SOI layer, and thus variations in elements which form the display panels can be suppressed.

Furthermore, the yield can be controlled on a panel-to-panel basis even if a defect occurs in a crystal of the SOI layer in transferring the SOI layers to the base substrate. Still furthermore, even if different kinds of materials are bonded to each other, stress can be alleviated because the SOI layers each having a panel size are transferred to the base substrate; accordingly, improvement in the yield can be achieved.

An SOI substrate according to the present invention can have a large area by providing a plurality of SOI layers over a base substrate. Accordingly, a large number of display panels can be manufactured by only one series of manufacturing process, and thus productivity of end products manufactured by incorporating the display panel can be improved.

Figure 9A:
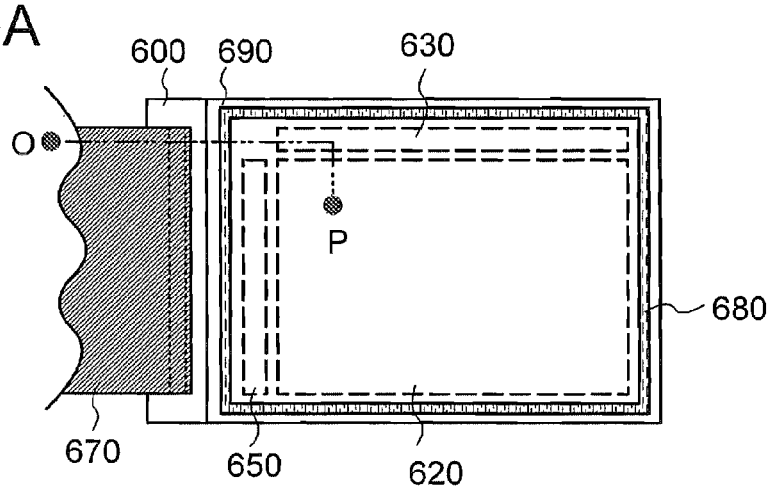
FIGS. 9A to 9C are a top view, a cross-sectional view, and a perspective view, respectively, showing an example of a display device according to the present invention.
Figure 9B:
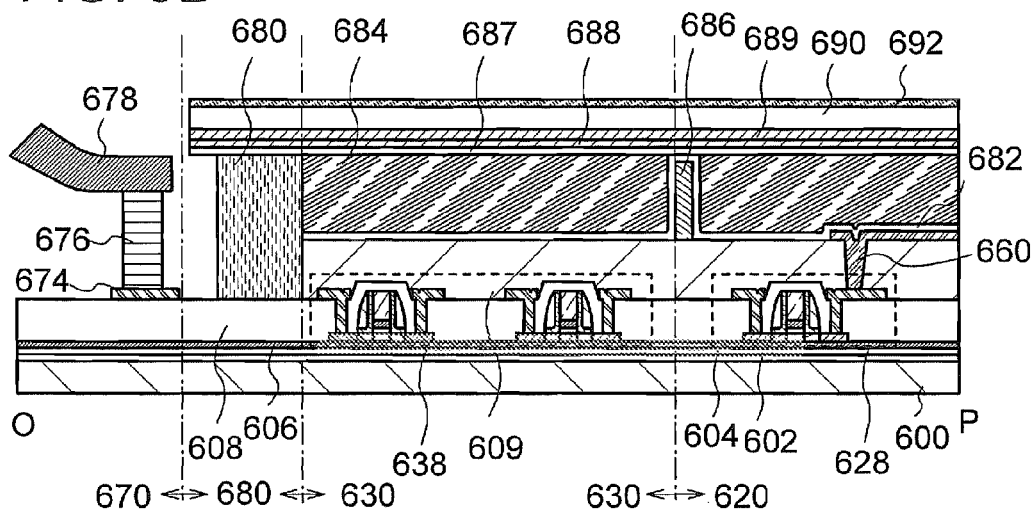
Figure 9C:
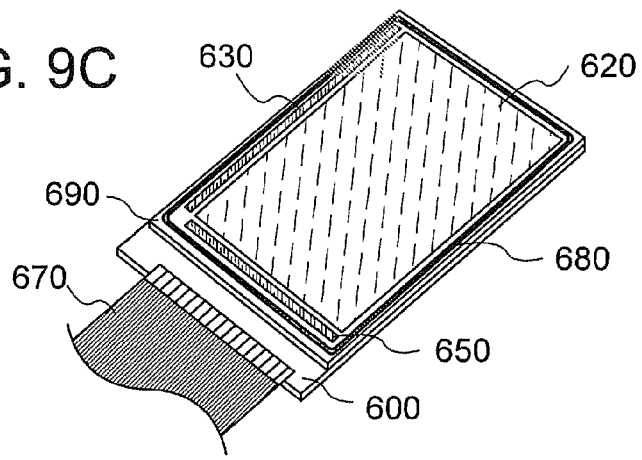

A display device can be manufactured with the use of an SOI substrate manufactured in the above manner. FIGS. 9A to 9C show schematic diagrams of an example of a display device according to the present invention. An example of forming a liquid crystal display device is shown here. FIG. 9A is a schematic diagram of a top view of an example. FIG. 9B is a cross-sectional diagram taken along a line OP of the example in FIG. 9A. FIG. 9C is a perspective view of the example of the display device.

The liquid crystal display device according to this embodiment mode includes a display portion 620, a first drive circuit portion 630, and a second drive circuit portion 650 over a first substrate 600. The display portion 620, the first drive circuit portion 630, and the second drive circuit portion 650 are sealed with a sealant 680 between the first substrate 600 and a second substrate 690. Further, a terminal region 670 where an external input terminal which transmits a signal or potential from the outside to the first drive circuit portion 630 and the second drive circuit portion 650 is connected is provided over the first substrate 600.

As shown in FIG. 9B, a pixel circuit portion 628 including a transistor is provided in the display portion 620. A peripheral circuit portion 638 including a transistor is provided in the first drive circuit portion 630. An insulating layer 602, an insulating layer 604, and a bonding layer 606 that function as base insulating layers are stacked in this order between the first substrate 600, and the pixel circuit portion 628 and the peripheral circuit portion 638. An insulating layer 608 and an insulating layer 609 that function as interlayer insulating layers are provided in or over the pixel circuit portion 628 and the peripheral circuit portion 638. A source region or a drain region of the transistor in the pixel circuit portion 628 is electrically connected to a pixel electrode 660 through an opening formed in the insulating layer 609. Although circuits including transistors are integrated in the pixel circuit portion 628, FIG. 9B shows a cross-sectional view of one transistor for sake of convenience. Also in the peripheral circuit portion 638, although circuits including transistors are integrated, a cross-sectional view of two transistors is shown for sake of convenience.

A liquid crystal layer 684 sandwiched between an orientation film 682 covering the pixel electrode 660, and an orientation film 687 is provided over the pixel circuit portion 628 and the peripheral circuit portion 638. In the liquid crystal layer 684, a distance (cell gap) is controlled with a spacer 686. The second substrate 690 is provided over the orientation film 687 with a counter electrode 688 and a color filter 689 interposed therebetween. The first substrate 600 and the second substrate 690 are bonded firmly with the sealant 680.

A polarizing plate 692 is provided for the outside of the second substrate 690. An example in which the polarizing plate is provided for the second substrate 690 is shown because this embodiment mode shows a reflective liquid crystal display device. In the case of a transmissive liquid crystal display device, for example, a polarizing plate may be provided for each of the first substrate 600 and the second substrate 690.

A terminal electrode 674 is provided for the terminal region 670. The terminal electrode 674 is electrically connected to an external input terminal 678 through an anisotropic conductive layer 676.

Next, an example of a manufacturing method of the liquid crystal display device shown in FIGS. 9A to 9C is described.

First, an SOI substrate according to the present invention is provided (see FIG. 11A). An example in which the SOI substrate similar to that shown in FIG. 2A is used is shown here.

A plurality of SOI layers 610 are provided over the substrate 600, which is a base substrate, with the insulating layers 602 and 604 and the bonding layer 606 interposed therebetween. The SOI layers 610 each have a desired panel size by being processed. Although an example in which a display device is manufactured using a panel formation region 610b including one SOI layer is described here for sake of convenience, it is possible to manufacture a display device also in an adjacent panel formation region 610a at the same time.

A substrate having an insulating surface or an insulating substrate is used for the substrate 600. For example, a variety of glass substrates for electronic industry which are called "alkali-free glass" such as aluminosilicate glass, alumino borosilicate glass, or barium borosilicate glass; a quartz substrate; a ceramic substrate; a sapphire substrate; or the like is used. In this example, a glass substrate is used.

The insulating layers 602 and 604 are provided in order to prevent diffusion of movable ions of an alkali metal, an alkaline earth metal, or the like from the glass substrate. Concretely, insulating layers similar to the above barrier layer may be formed. It is preferable to form an insulating layer containing nitrogen (e.g. a silicon nitride layer or a silicon nitride oxide layer) for at least one of the insulating layers 602 and 604. As the bonding layer 606, a silicon oxide layer similar to the bonding layer 122 may be formed.

This embodiment shows an example in which the insulating layers 602 and 604 are formed over the substrate 600, the bonding layer 606 is formed at a semiconductor substrate side from which an SOI layer is separated, the substrate 600 and the semiconductor substrate are bonded to each other, and then part of the semiconductor substrate is separated to form the SOI layer 610. Concretely, the bonding layer 606 formed over the semiconductor substrate is brought into close contact with the insulating layer 604 formed over the substrate 600 to bond the insulating layer 604 and the bonding layer 606 to each other, so that the substrate 600 and the semiconductor substrate are bonded to each other. In advance, a separation layer formed by irradiation with ions of hydrogen, helium, or halogen is formed in the semiconductor substrate at a given depth. And then, heat treatment is performed to separate part of the semiconductor substrate, the separation layer in the semiconductor substrate functioning as a cleavage plane, so that the SOI layer 610 is obtained. In this example, the bonding layer 606 is formed on the semiconductor substrate side, so that the bonding layer 606 has almost the same size as that of the SOI layer 610. That is to say, the bonding layer 606 is also split between the adjacent panel formation regions 610a and 610b in a similar manner to the SOI layer 610. Further, the insulating layers 602 and 604 form continuous layers across the panel formation regions 610a and 610b because the insulating layers 602 and 604 are formed over the substrate 600, which is a base substrate. The SOI substrate used may have any of the structures according to the present invention, and may have any of the structures shown in FIGS. 2A to 3B. For example, a bonding layer may be provided on a base substrate side, or an insulating layer such as a thermal oxidation film may be provided between the semiconductor substrate and the bonding layer.

The SOI layer 610 is selectively etched to form a first SOI layer 621 in the display portion 620, and a second SOI layer 631 and a third SOI layer 641 in the first drive circuit portion 630. And then gate electrodes 614 are formed over the first SOI layer 621, the second SOI layer 631, and the third SOI layer 641 with a gate insulating layer 612 interposed therebetween (see FIG. 11B).

The first SOI layer 621, the second SOI layer 631, and the third SOI layer 641 are obtained by etching the SOI layer 610 selectively to have a desired shape. In this embodiment mode, the SOI layer 610 is processed into a plurality of island shapes and separated. In the case where the thicknesses of the first SOI layer 621, the second SOI layer 631, and the third SOI layer 641 are desired to be smaller than that of the SOI layer of the prepared SOI substrate, the SOI layer may be etched to have smaller thicknesses. Alternatively, the SOI layer may be partially changed in its quality (quality change) and the changed portion may be selectively etched to have a smaller thickness. Quality change of the SOI layer indicates oxidation treatment, nitriding treatment, or the like. Further, the first SOI layer 621, the second SOI layer 631, and the third SOI layer 641 may be formed such that the end portion is either near-perpendicularly tapered or gently tapered by appropriate control of etching conditions or the like. For example, the end portion may be tapered at a taper angle of greater than or equal to 45° and less than 95°, preferably, greater than or equal to 60° and less than 95°, or may be gently tapered at a taper angle of less than 45°.

In order to control a threshold voltage of a transistor to be completed, an impurity element imparting one conductivity type may be added to the first SOI layer 621, the second SOI layer 631, and the third SOI layer 641 at a low concentration. In this case, the impurity element is also added to a channel formation region of the transistor. The impurity element added at this time is added at a lower concentration than that of a high concentration impurity region serving as a source region or a drain region and that of a low concentration impurity region serving as a lightly-doped drain (LDD) region.

The gate electrodes 614 are formed by forming a conductive layer entirely over the substrate and then etching the conductive layer selectively to form a desired shape. In this embodiment mode, as the gate electrodes 614, after stacked structures of conductive layers are formed, the conductive layers are selectively etched, so that the separated conductive layers cross the first SOI layer 621, the second SOI layer 631, and the third SOI layer 641, respectively.

The conductive layers forming the gate electrodes 614 can each be formed as follows: a conductive layer is formed entirely over the substrate by a CVD method or a sputtering method using a metal element such as tantalum (Ta), tungsten (W), titanium (Ti), molybdenum (Mo), chromium (Cr), aluminum (Al), copper (Cu), or niobium (Nb), or an alloy or compound material containing the above metal element, and then the conductive layer is selectively etched. Further, a semiconductor material typified by polycrystalline silicon to which an impurity element imparting one conductivity type such as phosphorus has been added can also be used.

Although this embodiment mode shows the example in which the gate electrodes 614 have a stacked structure of the two conductive layers, the gate electrodes may have a single-layer structure or a stacked-layer structure of three or more layers. In addition, the side face of the conductive layers may be tapered. In the case where the gate electrodes have a stacked-layer structure of conductive layers, the conductive layer in a lower portion may be wider than the conductive layer in an upper portion, or the side faces of the conductive layers may have different taper angles from each other.

The gate insulating layers 612 are formed between the first SOI layer 621 and the gate electrode 614, the second SOI layer 631 and the gate electrode 614, and the third SOI layer 641 and the gate electrode 614. The gate insulating layers 612 can be formed by a CVD method, a sputtering method, an ALD method, or the like using silicon oxide, silicon oxynitride, hafnium oxide, aluminum oxide, tantalum oxide, or the like. Further, the gate insulating layers 612 can also be formed by solid-phase oxidizing or solid-phase nitriding the first SOI layer 621, the second SOI layer 631, and the third SOI layer 641 by plasma treatment. Furthermore, insulating layers may be formed by a CVD method or the like and the insulating layers may be solid-phase oxidized or solid-phase nitrided by plasma treatment.

The solid-phase oxidation or the solid-phase nitridation is preferably performed using plasma excited by high frequency such as a microwave (typically, 2.45 GHz). Concretely, plasma which is excited by high-frequency waves and has an electron density of $1 \times 10^{11}$ to $1 \times 10^{13}$ cm$^{-3}$ inclusive and electron temperatures of 0.5 to 1.5 eV inclusive is preferably used for plasma treatment so that a dense insulating layer is formed and a practical reaction speed is achieved in the solid phase oxidation treatment or solid phase nitridation treatment at temperatures of lower than or equal to 500° C.

When the surfaces of the first SOI layer 621, the second SOI layer 631, and the third SOI layer 641 are oxidized by plasma treatment, the plasma treatment is performed in an atmosphere containing oxygen (e.g. an atmosphere containing oxygen, ozone, nitrous oxide, nitrogen monoxide, or nitrogen dioxide, and a rare gas (at least one of helium (He), neon (Ne), argon (Ar), krypton (Kr), and xenon (Xe)), or an atmosphere containing oxygen, ozone, nitrous oxide, nitrogen monoxide, or nitrogen dioxide, hydrogen, and a rare gas). When the surfaces of the insulating layers formed over the first SOI layer 621, the second SOI layer 631, and the third SOI layer 641 are nitrided by plasma treatment, the plasma treatment is performed in an atmosphere containing nitrogen (e.g. an atmosphere containing nitrogen and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar is preferably used, for example. Further, a gas in which Ar and Kr are mixed may also be used.

Figure 16:
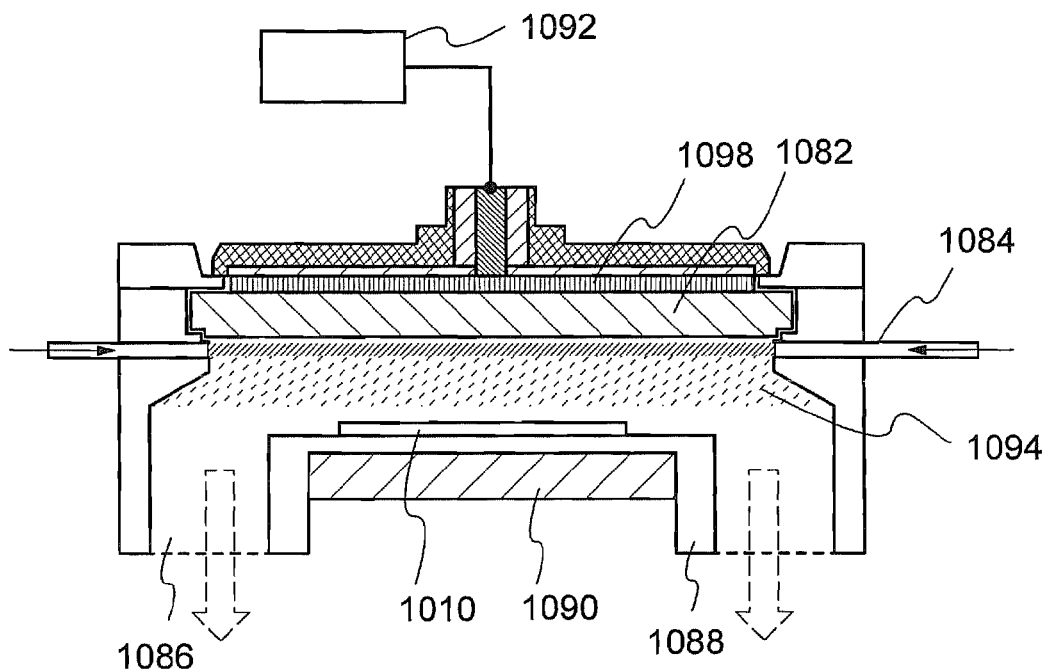
FIG. 16 is a diagram showing a structural example of a plasma process apparatus.

FIG. 16 shows a structural example of a plasma process apparatus 1080 for performing plasma treatment. The plasma process apparatus 1080 includes a support 1088, a gas supply portion 1084 for supplying a gas, an exhaust port 1086 that is connected to a vacuum pump to exhaust a gas, an antenna 1098, a dielectric plate 1082, and a high-frequency wave supply portion 1092 for supplying high-frequency waves for plasma generation. An object to be processed 1010 is held by the support 1088. In addition, if a temperature controller 1090 is provided for the support 1088, the temperature of the object to be processed 1010 can be controlled. The object to be processed 1010 is a body which is subjected to plasma treatment. In this embodiment mode, the object to be processed 1010 corresponds to a stacked body in which the insulating layer 602 and 604, the bonding layer 606, and the first SOI layer 621 are stacked; a stacked body in which the insulating layer 602 and 604, the bonding layer 606, and the second SOI layer 631 are stacked; and a stacked body in which the insulating layer 602 and 604, the bonding layer 606, and the third SOI layer 641 are stacked. Alternatively, the object to be processed 1010 corresponds to a stacked body in which an insulating layer is formed over the first SOI layer 621, a stacked body in which an insulating layer is formed over the second SOI layer 631, and a stacked body in which an insulating layer is formed over the third layer 641.

Hereinafter, a specific example is described in which an insulating layer is formed on the surface of the semiconductor layer with the plasma process apparatus 1080 shown in FIG. 16. Examples of the plasma treatment include surface modification treatment, such as oxidation treatment, nitridation treatment, oxynitridation treatment, or hydrogenation treatment, performed to a substrate, a semiconductor layer (an SOI layer), an insulating layer, or a conductive layer. For these treatments, a gas supplied from the gas supply portion 1084 may be determined in accordance with an intended purpose.

First, a process chamber of the plasma process apparatus 1080 shown in FIG. 16 is evacuated of air and a gas containing a rare gas and oxygen or nitrogen is supplied from the gas supply portion 1084. The object to be processed 1010 is heated at room temperature or at temperatures of 100 to 550° C. inclusive, by the temperature controller 1090. The distance between the object to be processed 1010 and the dielectric plate 1082 (hereinafter, also referred to as an electrode interval) is about 20 to 200 mm inclusive (preferably, 20 to 60 mm inclusive).

Next, high-frequency waves are supplied from the high-frequency wave supply portion 1092 to the antenna 1098.

Here, microwaves (frequency: 2.45 GHz) are introduced as the high-frequency waves. Then, the microwaves are introduced from the antenna 1098 into the process chamber through the dielectric plate 1082; thus, plasma 1094 is generated. With the plasma 1094, oxygen radicals (which may include an OH radical) or nitrogen radicals (which may include an NH radical) are generated. At this time, the plasma 1094 is generated using the gas supplied.

When the plasma 1094 is generated by introducing high-frequency waves such as microwaves, plasma with the low electron temperature (less than or equal to 3 eV, preferably, less than or equal to 1.5 eV) and the high electron density (greater than or equal to $1 \times 10^{11}$ cm$^{-3}$) can be generated. Concretely, plasma with electron temperatures of 0.5 to 1.5 eV inclusive, and an electron density of $1 \times 10^{11}$ to $1 \times 10^{13}$ cm$^{-3}$ inclusive, is preferably generated. In this description, plasma which has the low electron temperature and the high electron density and is generated by introducing microwaves is also called "high-density plasma". Further, plasma treatment utilizing high-density plasma is also called "high-density plasma treatment".

With the oxygen radicals (which may include an OH radical) or nitrogen radicals (which may include an NH radical) generated by the plasma 1094, the surface of the SOI layer formed in the object to be processed 1010 is oxidized or nitrided, whereby an insulating layer is formed. Alternatively, the surface of the insulating layer formed over the SOI layer or the vicinity of the surface is oxidized or nitrided. At this time, if the rare gas such as argon is mixed in the gas supplied, oxygen radicals or nitrogen radicals can be generated efficiently by excited species of the rare gas. In the case where the rare gas is used in the gas supplied, the rare gas may be contained in the insulating layer formed. In this method, oxidation or nitridation by a solid phase reaction can be performed at low temperatures of lower than or equal to 500° C. by effective use of active radicals excited by plasma.

One preferable example of manufacturing the gate insulating layer 612 formed by plasma treatment in this embodiment mode is as follows: the first SOI layer 621, the second SOI layer 631, and the third SOI layer 641 are subjected to plasma treatment in an atmosphere containing oxygen to form silicon oxide layers, and the surfaces of the silicon oxide layers are treated with nitridation plasma in an atmosphere containing nitrogen to form nitrogen-plasma-treated layers. Concretely, first, the silicon oxide layers having thicknesses of 3 to 6 nm inclusive are formed on the first SOI layer 621, the second SOI layer 631, and the third SOI layer 641 by plasma treatment in an atmosphere containing oxygen. Subsequently, the plasma treatment in an atmosphere containing nitrogen is performed, whereby the nitrogen-plasma-treated layers with high nitrogen concentration are provided for the surfaces of the silicon oxide layers or in the vicinity of the surfaces. The "the vicinity of the surface" refers to a region at a depth of about 0.25 to 1.5 nm inclusive from the surface of the silicon oxide layer. For example, by performing the plasma treatment in an atmosphere containing nitrogen after forming the silicon oxide layers, the nitrogen-plasma-treated layers in which nitrogen is contained at 20 to 50 at. % inclusive can be formed in the silicon oxide layers at depths of about 1 nm from the surfaces thereof in a perpendicular direction. The nitrogen-plasma-treated layers can be formed using silicon nitride or silicon nitride oxide depending on the conditions of the plasma treatment.

In any case, by the solid phase oxidation treatment or solid phase nitridation treatment with plasma treatment as described above, even if a glass substrate with a heat-resistant temperature of lower than or equal to 600° C. is used as the substrate 600, insulating layers that are equivalent to thermally-oxidized films formed at temperatures of 950 to 1050° C. inclusive can be obtained. That is, highly reliable insulating layers can be formed as the insulating layers that serve as gate insulating layers in semiconductor elements, in particular, thin film transistors or nonvolatile memory elements.

FIG. 11B shows an example in which the end portions of the gate insulating layer 612 and the gate electrode 614 are aligned; however, this is not a limiting example, and the gate insulating layer 612 may be left in etching the gate electrode 614.

If a material with a high dielectric constant (also referred to as a high-k material) is used for the insulating layers 612, the gate electrodes 614 are formed using polycrystalline silicon, silicide, metal, or metal nitride. Preferably, the gate electrodes 614 are formed using metal or metal nitride. For example, in the gate electrodes 614, the conductive layers in contact with the gate insulating layers 612 are formed using a metal nitride material, and the conductive layers thereon are formed using a metal material. The combination like this can prevent a depletion layer from spreading in the gate electrodes even if the gate insulating layers are thinned, and further can prevent driving performance of transistors from being damaged even if miniaturization is done.

Next, an insulating layer 616 is formed over the gate electrodes 614. Then, an impurity element imparting one type of conductivity is added using the gate electrodes 614 as masks (see FIG. 11C). This embodiment mode shows an example in which impurity elements imparting different types of conductivity are added to the second SOI layer 631 and the third SOI layer 641 in a first drive circuit portion 630. This embodiment mode further shows an example in which an impurity element imparting the same type of conductivity as that of the second SOI layer 631 is added to the first SOI layer 621 in a display portion 620.

In the first SOI layer 621 formed in the display portion 620, a pair of impurity regions 623 and a channel formation region 622 located between the pair of impurity regions 623 are formed in a self-aligned manner using the gate electrode 614 as a mask.

In the second SOI layer 631 formed in the first drive circuit portion 630, a pair of impurity regions 633 and a channel formation region 632 located between the pair of impurity regions 633 are formed in a self-aligned manner using the gate electrode 614 as a mask. In the third SOI layer 641, a pair of impurity regions 643 and a channel formation region 642 located between the pair of impurity regions 643 are formed in a self-aligned manner using the gate electrode 614 as a mask. Impurity elements imparting different types of conductivity are added to the impurity regions 633 and 643.

As the impurity element which imparts one type of conductivity, an element which imparts p-type conductivity such as boron (B), aluminum (Al), or gallium (Ga), or an element which imparts n-type conductivity such as phosphorus (P) or arsenic (As) can be used. In this embodiment mode, an element imparting n-type conductivity, e.g., phosphorus, is added to the first SOI layer 621 formed in the display portion 620 and the second SOI layer 631 formed in the first drive circuit portion 630. In addition, an element imparting p-type conductivity, e.g., boron, is added to the third SOI layer 641. When the impurity element is added to the first SOI layer 621 and the second SOI layer 631, the third SOI layer 641 may be selectively covered with a resist mask or the like. Similarly, when the impurity element is added to the third SOI layer 641, the first SOI layer 621 and the second SOI layer 631 may be selectively covered with a resist mask or the like.

The insulating layer 616 can be formed by a CVD method, a sputtering method, an ALD method, or the like using silicon oxide, silicon oxynitride, silicon nitride, silicon nitride oxide, or the like. With a structure in which the impurity element is added by passing through the insulating layer 616 in adding the impurity element that imparts one type of conductivity, damage to the SOI layers can be reduced.

Next, sidewall insulating layers 618 are formed on the side surfaces of the gate electrodes 614. Then, the impurity element imparting one type of conductivity is added using the gate electrodes 614 and the sidewall insulating layers 618 as masks (see FIG. 11D). At this time, the impurity elements having the same conductivity types as those used in the previous step (the steps of forming the impurity regions 623, 633, and 643) are added to the first SOI layer 621, the second SOI layer 631, and the third SOI layer 641. The impurity elements added at this time are added at higher concentrations than those of the impurity elements used in the previous step.

In the first SOI layer 621, a pair of high concentration impurity regions 626 and a pair of low concentration impurity regions 624 are formed in a self-aligned manner using the gate electrode 614 and the sidewall insulating layers 618 as a mask. The high concentration impurity regions 626 formed at this time serve as a source region and a drain region, and the low concentration impurity regions 624 serve as LDD (lightly doped drain) regions.

In the second SOI layer 631, a pair of high concentration impurity regions 636 and a pair of low concentration impurity regions 634 are formed in a self-aligned manner using the gate electrode 614 and the sidewall insulating layers 618 as a mask. The high concentration impurity regions 636 formed at this time serve as a source region and a drain region, and the low concentration impurity regions 634 serve as LDD regions. In the third SOI layer 641, a pair of high concentration impurity regions 646 and a pair of low concentration impurity regions 644 are formed in a self-aligned manner using the gate electrode 614 and the sidewall insulating layers 618 as a mask. When the impurity element is added to the first SOI layer 621 and the second SOI layer 631, the third SOI layer 641 may be selectively covered with a resist mask or the like. Similarly, when the impurity element is added to the third SOI layer 641, the first SOI layer 621 and the second SOI layer 631 may be selectively covered with a resist mask or the like.

The sidewall insulating layers 618 is provided for the side surfaces of the gate electrodes 614 with the insulating layer 616 therebetween. For example, the sidewall insulating layers 618 can be provided for the side surfaces of the gate electrodes 614 in a self-aligned manner by anisotropic etching, which proceeds mainly in the perpendicular direction, of an insulating layer formed to bury the gate electrodes 614. The sidewall insulating layers 618 can be formed using silicon nitride, silicon nitride oxide, silicon oxide, silicon oxynitride, or the like. In the case where the insulating layer 616 is formed using silicon oxide or silicon oxynitride, the insulating layer 616 can function as an etching stopper if the sidewall insulating layers 618 is formed using silicon nitride or silicon nitride oxide. In the case where the insulating layer 616 is formed using silicon nitride or silicon nitride oxide, the sidewall insulating layers 618 are preferably formed using silicon oxide or silicon oxynitride. When the insulating layer functioning as an etching stopper is provided in this manner, the SOI layers can be prevented from being etched because of over-etching in forming the sidewall insulating layers.

Next, exposed portions of the insulating layer 616 are etched (see FIG. 12A). The insulating layer 616 is left between the sidewall insulating layers 618 and the gate electrode 614, between the sidewall insulating layers 618 and the first SOI layer 621, between the sidewall insulating layers 618 and the second SOI layer 631, and between the sidewall insulating layers 618 and the third SOI layer 641.

A silicide layer may be formed in order to lower the resistance of the high concentration impurity region functioning as a source region and a drain region. For the silicide layer, cobalt silicide or nickel silicide is preferably applied. If the SOI layer has a small thickness, a silicide reaction may proceed to the bottom portion of the SOI layer in which the high concentration impurity region is formed, so that the SOI layer in which the high concentration impurity region is formed may fully be silicided.

Next, an insulating layer 608 is formed entirely over the substrate 600 and then is etched selectively, so that openings are formed to reach the high concentration impurity regions 626 formed in the first SOI layer 621 in the display portion 620. Further, openings are formed to reach the high concentration impurity regions 636 formed in the second SOI layer 631 and the high concentration impurity regions 646 formed in the third SOI layer 641 in the first drive circuit portion 630. Then, conductive layers 619 are formed so as to fill the openings. Further, a terminal electrode 674 is formed in a terminal region 670 (see FIG. 12B).

The insulating layer 608 is formed by a CVD method, a sputtering method, an ALD method, a coating method, or the like to have a single-layer structure or a stacked-layer structure. For example, the insulating layer 608 can be formed by a CVD method, a sputtering method, or an ALD method using an inorganic insulating material containing oxygen and/or nitrogen, such as silicon oxide, silicon nitride, silicon oxynitride, or silicon nitride oxide, or an insulating material containing carbon, such as diamond like carbon (DLC); or can be formed by a coating method using an organic insulating material such as epoxy, polyimide, polyamide, polyvinylphenol, benzocyclobutene, or acrylic, or a siloxane material such as a siloxane resin. Further, the insulating layer 608 may have a stacked-layer structure of a layer formed using an inorganic insulating material or an insulating material containing carbon and a layer formed using an organic insulating material or a siloxane material. The siloxane material corresponds to a material having Si—O—Si bonds. Siloxane includes a skeleton structure of a bond of silicon (Si) and oxygen (O). As a substituent, an organic group containing at least hydrogen (e.g. an alkyl group or aromatic hydrocarbon) is used. Alternatively, a fluoro group, or a fluoro group and an organic group containing at least hydrogen can be used as a substituent. Further, as the insulating layer 608, an insulating layer may be formed by a CVD method, a sputtering method, or an ALD method, and then be subjected to plasma treatment in an oxygen atmosphere or a nitrogen atmosphere. Although this embodiment mode shows an example in which the insulating layer 608 has a single-layer structure, the insulating layer 608 may have a stacked-layer structure of two or more layers. Furthermore, an inorganic insulating layer and an organic insulating layer may be combined to form the insulating layer 608. For example, a silicon nitride film or a silicon nitride oxide film, which can serve as a passivation layer, can be formed over the entire surface of the substrate 600, and an insulating layer formed using phosphorus silicate glass (PSG) or boron phosphorus silicate glass (BPSG), which can serve as a planarization layer, can be formed thereon.

The conductive layers 619 function as source electrodes and drain electrodes. The conductive layers 619 functioning as source electrodes and drain electrodes are electrically connected to the first SOI layer 621, the second SOI layer 631, and the third SOI layer 641 through the openings formed in the insulating layer 608.

The conductive layers 619 can be formed in the following manner, for example: a conductive layer is formed over the entire surface of the substrate, to have a single-layer structure or a stacked-layer structure, by a CVD method or a sputtering method, using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy or compound material containing the above metal element; and then the conductive layer is selectively etched. As examples of an alloy material containing aluminum, an alloy material containing aluminum as its main component and further containing nickel, and an alloy material containing aluminum as its main component and further containing nickel and either or both of carbon and silicon can be given. Further, as an example of a compound material containing tungsten, tungsten silicide can be given. The conductive layers 619 can employ a stacked-layer structure of a barrier layer, an aluminum-silicon layer, and a barrier layer, or a stacked-layer structure of a barrier layer, an aluminum-silicon layer, a titanium nitride layer, and a barrier layer, for example. A barrier layer corresponds to a thin film formed of titanium, nitride of titanium, molybdenum, or nitride of molybdenum. Aluminum or aluminum silicon, which has low resistance and is inexpensive, is the most suitable for forming the conductive layers serving as source electrodes and drain electrodes. Further, generation of a hillock of aluminum or aluminum silicon can be prevented if upper and lower barrier layers are provided in the conductive layers serving as source electrode and drain electrodes.

The terminal electrode 674 in the terminal region 670 functions as an electrode for connecting the external input terminal (e.g. FPC) that is formed later to the first drive circuit portion 630 and the second drive circuit portion 650. An example is shown here in which the terminal electrode 674 is formed using the same material and with the same layer as that of the conductive layers 619.

In the above manner, the pixel circuit portion 628 including the transistor including the first SOI layer 621 is formed in the display portion 620. Further, the peripheral circuit portion 638 including the transistor including the second SOI layer 631 and the transistor including the third SOI layer 641 is formed in the first drive circuit portion 630.

Next, the insulating layer 609 is formed over the display portion 620 and the first drive circuit portion 630. The insulating layer 609 over the display portion 620 is selectively etched to form an opening that reaches the conductive layer 619 of the transistor in the pixel circuit portion 628. And then, the pixel electrode 660 is formed so as to fill in the opening (see FIG. 12C).

As the insulating layer 609, it is preferable to form a planarizing layer, which can planarize asperities in the display portion 620 and the first drive circuit portion 630 and form a planar surface. The planarizing layer can be formed using an organic insulating material such as epoxy, polyimide, polyamide, polyvinyl phenol, benzocyclobutene, or acrylic, or a siloxane material such as a siloxane resin, for example. Although an example in which the insulating layer 609 has a single-layer structure is shown here, the insulating layer 609 may have a stacked-layer structure including two or more layers. In the case of a stacked-layer structure, for example, the insulating layer 609 can have a stacked-layer structure including an organic resin layer or the like as an upper layer and an inorganic insulating layer of silicon oxide, silicon nitride, silicon oxynitride, or the like as a lower layer; or a structure in which an organic insulating layer is sandwiched between inorganic insulating layers. The insulating layer 609 can be formed by being deposited over the entire surface of the substrate, and then being selectively etched in regions other than desired regions (the display portion 620 and the first drive circuit portion 630 are the desired regions in this case). It is also possible to form the insulating layer 609 selectively by a variety of printing methods (e.g. screen printing, planographic printing, relief printing, or gravure printing), a droplet discharging method, a dispenser method, or the like.

In this embodiment mode, the pixel electrode 660 functions as a reflective electrode. Therefore, the pixel electrode 660 is formed using a conductive material which reflects light. As such a material, a metal element such as tantalum (Ta), tungsten (W), titanium (Ti), molybdenum (Mo), aluminum (Al), chromium (Cr), or silver (Ag); or an alloy or compound material containing such an metal element can be used. If another reflective layer is formed or the display device is a transmissive type, the pixel electrode 660 may be formed using a conductive material which transmits light. As the conductive material which transmits light, indium tin oxide (ITO), indium tin oxide containing silicon oxide (ITSO), zinc oxide (ZnO), indium zinc oxide (IZO), zinc oxide to which gallium is added (GZO), or the like can be used.

Next, the spacer 686 is formed, and then the orientation film 682 is formed so as to cover the pixel electrode 660 and the spacer 686. Next, the sealant 680 is formed so as to surround the display portion 620, the first drive circuit portion 630, and the second drive circuit portion 650 (see FIG. 13A).

The spacer 686 can be formed using an organic insulating material such as epoxy, polyimide, polyamide, polyimide amide, or acrylic; or an inorganic insulating material such as silicon oxide, silicon nitride, silicon oxynitride, or silicon nitride oxide, to have a single-layer structure or a stacked-layer structure. In this embodiment mode, in order to form a columnar spacer as the spacer 686, an insulating layer is formed over the entire surface of the substrate and then is etched, so that the spacer with a desired shape is obtained. The shape of the spacer 686 is not particularly limited, and spherical spacers may be dispersed. The spacer 686 can retain the cell gap.

For the orientation film 682, a material may be determined corresponding with an operation mode of liquid crystals, and a layer which can orient the liquid crystals in a uniform direction is formed. For example, a layer is formed using polyimide, polyamide, or the like and undergoes orientation treatment, so that the layer can function as the orientation film. As the orientation treatment, rubbing, or irradiation with an ultraviolet ray or the like may be performed, for example. Although the method for forming the orientation film 682 is not particularly limited, the orientation film 682 can be formed selectively over the insulating layer 609 if a variety of printing methods or a droplet discharging method is used.

The sealant 680 is formed so as to surround at least the display portion after completing the display device. In this embodiment mode, a frame-shaped seal pattern is formed so as to surround the periphery of the display portion 620, the first drive circuit portion 630, and the second drive circuit portion 650. As the sealant 680, a thermosetting resin or a photo-curing resin can be used. The cell gap can be retained also by making a filler included in the sealant. The sealant 680 sets by performing light irradiation, heat treatment, or the like in a later step of sealing the substrate and another substrate over which a counter electrode, a color filter, or the like is provided.

The liquid crystal layer 684 is formed in a region surrounded by the sealant 680. Further, the second substrate 690 over which the color filter 689, the counter electrode 688, and the orientation film 687 are stacked in this order is bonded to the first substrate 600 (see FIG. 13B).

The liquid crystal layer 684 is formed using a desired liquid crystal material. For example, the liquid crystal layer 684 can be formed by dripping the liquid crystal material into the frame-shaped seal pattern formed with the sealant 680. The liquid crystal material may be dripped by a dispenser method or a droplet discharging method. It is preferable that the liquid crystal material be degassed under a reduced pressure in advance or after being dripped. Further, it is preferable that the liquid crystal material be dripped in an inert atmosphere so that impurities or the like are not mixed therein. Further, it is preferable that an atmosphere be set under a reduced pressure after forming the liquid crystal layer 684 by dripping the liquid crystal material until attaching the first substrate 600 and the second substrate 690 to each other so that a bubble or the like is not formed in the liquid crystal layer 684.

It is also possible to form the liquid crystal layer 684 by attaching the first substrate 600 and the second substrate 690 to each other and then injecting the liquid crystal material into the inside of the frame-shaped pattern of the sealant 680 using a capillary phenomenon. In this case, an opening for injecting the liquid crystal is formed in advance in the sealant or the like. It is preferable that the liquid crystal material be injected under a reduced pressure.

The first substrate 600 and the second substrate 690 are arranged to face each other, brought into close contact with each other, and then the sealant 680 is made to set, so that the first substrate 600 and the second substrate 690 can be attached to each other. At this time, the first substrate 600 and the second substrate 690 are attached to each other so that the liquid crystal layer 684 is sandwiched between the orientation film 687 provided for the second substrate 690 and the orientation film 682 provided for the first substrate 600. It is also possible to correct orientation disorder of the liquid crystal layer 684 by heat treatment after attaching the first substrate 600 and the second substrate 690 to each other and forming the liquid crystal layer 684.

For the second substrate 690, a substrate which transmits light is used. For example, a variety of glass substrates such as aluminosilicate glass, aluminoborosilicate glass, or barium borosilicate glass; a quartz substrate; a ceramic substrate; or a sapphire substrate can be used.

Before the attaching, the color filter 689, the counter electrode 688, and the orientation film 687 are formed in this order over the second substrate 690. In addition to the color filter 689, a black matrix may be provided for the second substrate 690. The color filter 689 may be provided for the outside of the second substrate 690. The color filter 689 may be omitted if the display device performs monochrome display. The sealant may be provided for the second substrate 690 side. In the case where the sealant is provided for the second substrate 690 side, the liquid crystal material is dripped into the inside of a frame-shaped pattern provided for the second substrate 690.

The counter electrode 688 can be formed using a conductive material which transmits light, such as indium tin oxide (ITO), indium tin oxide containing silicon oxide (ITSO), zinc oxide (ZnO), indium zinc oxide (IZO), or zinc oxide to which gallium is added (GZO). The orientation film 687 can be formed in a similar manner to the orientation film 682.

In the above manner, a structure is obtained in which the display portion 620, the first drive circuit portion 630, and the second drive circuit portion 650 that include the liquid crystal layer 684 are sealed between the first substrate 600 and the second substrate 690. In the circuit portion formed in the display portion 620, the first drive circuit portion 630, or the second circuit portion 650, a resistor, a capacitor, or the like may be formed at the same time in addition to the transistor. Further, the structure of the transistor is not particularly limited. For example, the transistor can have a multi-gate structure in which a plurality of gates are provided with respect to one SOI layer.

Next, the first substrate 600 and the second substrate 690 that are attached to each other are divided into sections each having a desired panel size (see FIG. 14A). In this embodiment mode, the first substrate 600 and the second substrate 690 that are attached to each other are divided so that the panel formation regions 610a and 610b are separated from each other. The terminal electrode 674 is exposed at a separated surface. The display portion 620 and the first drive circuit portion 630 that include the liquid crystal layer 684 are sealed with the sealant 680. The first substrate 600 and the second substrate 690 can be divided with a cutting apparatus such as a scriber apparatus, a breaker apparatus, or a roll cutter.

Next, the second substrate 690 over the terminal region 670 is divided (see FIG. 14B). In this embodiment mode, the division is performed so that the second substrate 690, the color filter 689, the counter electrode 688, and the orientation film 687 over the terminal electrode 674 are removed. In the above manner, a display panel having a desired panel size can be obtained.

Here, the division of the attached substrates is described in detail with reference to schematic views of the top surface shown in FIGS. 10A to 10D.

Figure 10A:
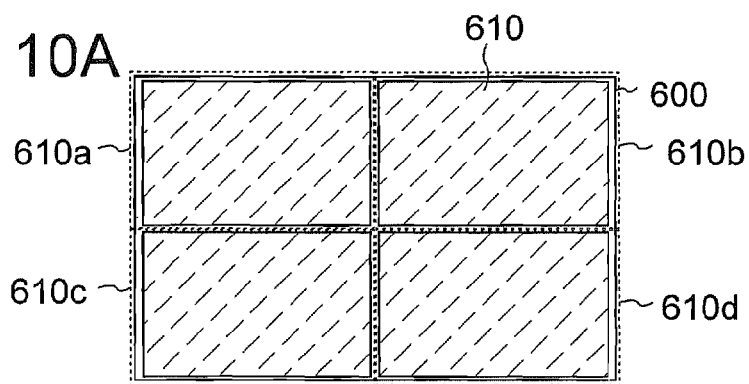
FIGS. 10A to 10D are top views showing an example of a method for manufacturing a display device according to the present invention.

FIG. 10A is a schematic view of the top surface corresponding to the SOI substrate shown in FIG. 11A. An example is shown here in which the panel formation region 610a, the panel formation region 610b, a panel formation region 610c, and a panel formation region 610d each including the divided SOI layer 610 are formed over the one substrate 600. The SOI layer 610 provided for each of the panel formation regions 610a to 610d has a desired panel size.

Figure 10B:
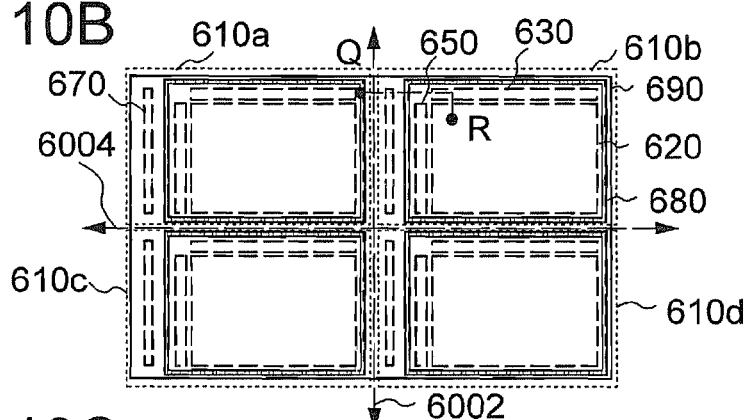

FIG. 10B is a schematic view of the top surface of display panels in which the step of attaching the second substrate 690 to the first substrate 600 is completed as shown in FIG. 13B after the steps shown in FIGS. 11B to 13A. The display portion 620, the first drive circuit portion 630, and the second drive circuit portion 650 are provided and sealed with the sealant 680 in each of the panel formation regions 610a to 610d. FIG. 13B corresponds to a cross-sectional view taken along a line QR in FIG. 10B.

Next, the first substrate 600 and the second substrate 690 that are attached to each other are divided in directions of an arrow 6002 and an arrow 6004 in FIG. 10B to be split into the panel formation regions. FIG. 14A corresponds to a cross-sectional view taken along a line Q'R' in FIG. 10C.

Figure 10C:
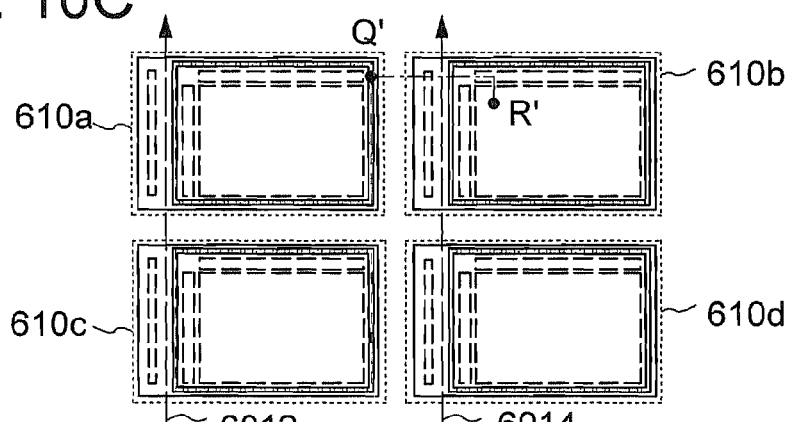
Figure 10D:
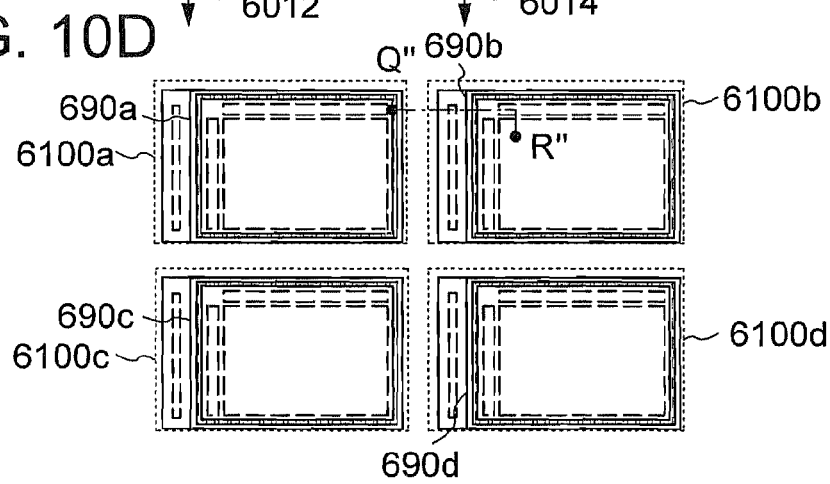

Next, the second substrate 690 is divided in directions of an arrow 6012 and an arrow 6014 in FIG. 10C, so that the terminal region 670 is exposed as shown in FIG. 10D. The terminal region 670 includes the terminal electrode 674, which is later connected to the external input terminal using the anisotropic conductive layer or the like. FIG. 14B corresponds to a cross-sectional view taken along a line Q"R" in FIG. 10D. In the above manner, display panels 6100a, 6100b, 6100c, and 6100d can be obtained. The element that constitutes the display panel 6100a includes one SOI layer provided in the panel formation region 610a. Similarly, the elements that constitute the other display panels each include one SOI layer provided in each of the panel formation regions. Therefore, variation in characteristics can be suppressed.

Although an example is shown here in which the first substrate 600 and the second substrate 690 that are attached to each other are divided and then the second substrate 690 is further divided, the second substrate 690 which is processed to have a desired size in advance may be attached to the first substrate 600.

Further, although an example in which four display panels are manufactured using one base substrate is shown here for sake of convenience, the present invention is not particularly limited to this. As described above, a plurality of SOI layers each having a desired panel size are provided for an SOI substrate according to the present invention, and a plurality of display panels can be manufactured at a time using each of the SOI layers. Therefore, the number of display panels that can be manufactured using one base substrate increases in proportion to the number of SOI layers provided over the base substrate, so that the productivity improves dramatically.

Figure 15:
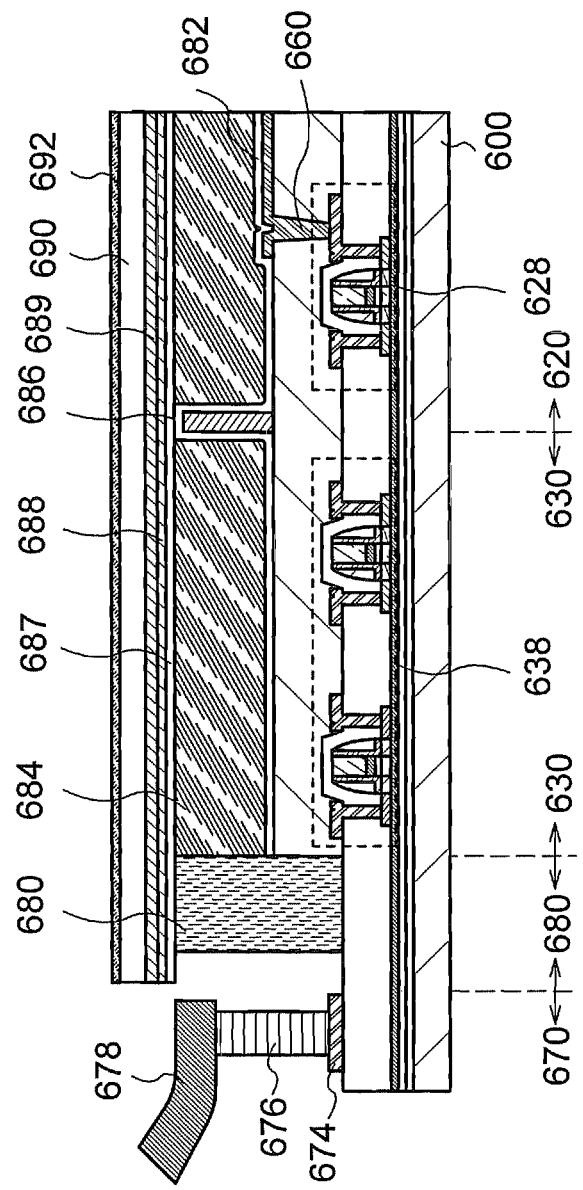
FIG. 15 is a cross-sectional view showing an example of a method for manufacturing a display device according to the present invention.

Next, the polarizing plate 692 is provided for the second substrate 690. Further, the external input terminal 678 is connected to the terminal electrode 674 through the anisotropic conductive layer 676, so that the display panel is connected electrically to the outside (see FIG. 15).

The polarizing plate 692 is provided for the outside (a side with which the liquid crystal layer 684 and the like is not sealed) of the second substrate 690. In the case where the liquid crystal display device is a transmissive type, another polarizing plate may be provided for the outside (a side with which the liquid crystal layer 684 and the like is not sealed) of the first substrate 600. In addition to the polarizing plate, an optical film such as a retardation plate or an anti-reflection film may be provided.

The external input terminal 678 has a function of transmitting a signal (e.g. a video signal, a clock signal, a start signal, or a reset signal) or potential from the outside. In this embodiment mode, an FPC is connected as the external input terminal 678. The terminal electrode 674 is connected electrically to the first drive circuit portion 630 and the second drive circuit portion 650.

In the above manner, the display device can be obtained. In the case where the liquid crystal display device is a reflective type, a light source such as a cold-cathode tube or an LED element; a front light constructed of a light guide plate and the like; a reflective sheet; and the like may be provided although display is possible with the use of external light (e.g. sunlight or indoor light) or the like. The front light can be provided for a viewing side of the display device. Provision of the front light enables clear display even if external light cannot be provided sufficiently.

In the case where the liquid crystal display device is a transmissive type or a semitransmissive type, a backlight constructed of a light source such as a cold-cathode tube or an LED element, a light guide plate, a reflective sheet, and the like is provided. The backlight is provided for an opposite side (a back side) to the viewing side of the display device. In the case where the liquid crystal display device is a transmissive type, light from a light source is transmitted to a viewing side, whereby display can be performed.

In this embodiment mode, an SOI substrate for which a plurality of SOI layers each having a desired panel size are provided over the substrate 600 is used. The SOI layer for forming elements is split for each display panel that constitutes one display device. Therefore, damage to the SOI layer can be prevented in dividing the SOI layer into each display panel, so that a yield can be improved. Further, variation in characteristics can be suppressed because elements that constitute one display device are formed using one SOI layer.

Figure 21:
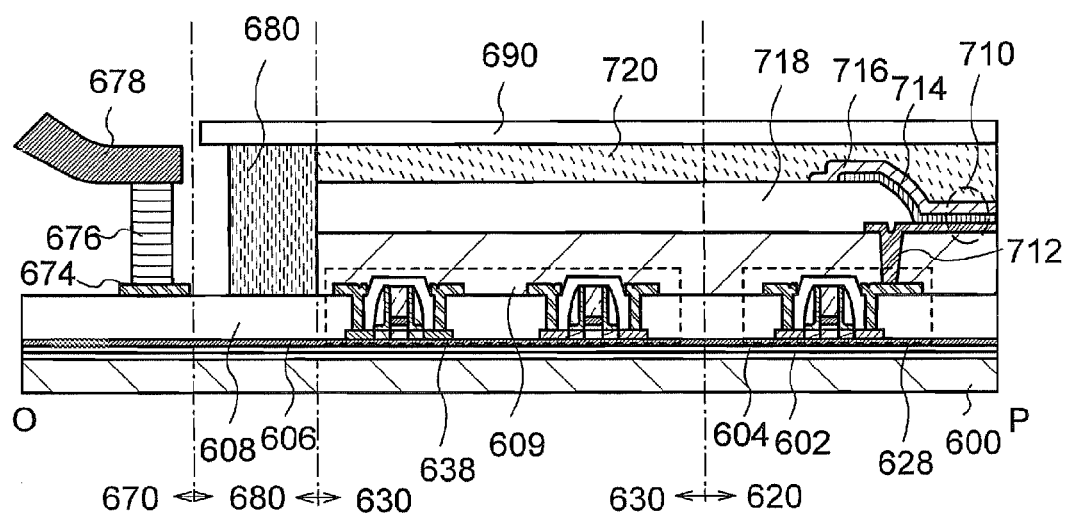
FIG. 21 is a cross-sectional view showing an example of a display device according to the present invention.
Figure 22:
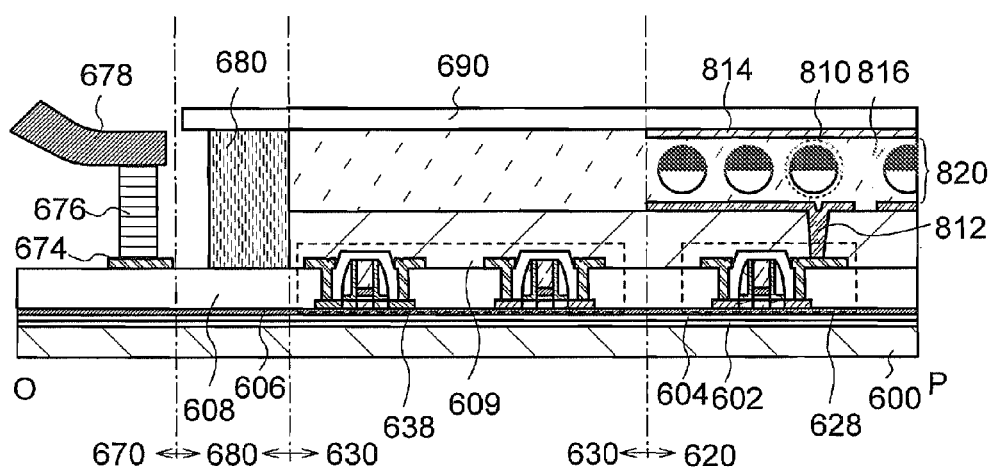
FIG. 22 is a cross-sectional view showing an example of a display device according to the present invention.

Although FIGS. 9A to 15 show an example in which a display device including a liquid crystal element as a display element is manufactured, the present invention is not particularly limited to this example. For example, a light-emitting element or an electrophoretic element can be used. FIG. 21 shows an example of a display device including a light-emitting element (also referred to as a light-emitting device or an EL display device). FIG. 22 shows an example of a display device including an electrophoretic element (also referred to as electronic paper or an electrophoretic display device). Explanation thereof is omitted because structures other than those of display elements are similar to those shown in FIGS. 9A to 15.

FIG. 21 shows a display device including a light-emitting element 710 instead of a liquid crystal element. This embodiment mode shows an example in which an organic compound layer 714 is sandwiched between a pixel electrode (cathode) 712 and a counter electrode (anode) 716. The organic compound layer 714 includes at least a light-emitting layer, and may further include an electron-injecting layer, an electron-transporting layer, a hole-transporting layer, a hole-injecting layer, and the like. An end portion of the pixel electrode 712 is covered with a partition layer 718. The partition layer 718 may be formed in the following manner: an insulating material is deposited over an entire substrate and processed so that part of the pixel electrode 712 is exposed; or it is selectively formed by a droplet discharging method or the like. The organic compound layer 714 and the counter electrode 716 are stacked in this order over the pixel electrode 712 and the partition layer 718. Space 720 between the light-emitting element 710 and the second substrate 690 may be filled with an inert gas or the like, or a resin or the like may be formed in the space 720.

FIG. 22 shows a display device including an electrophoretic element instead of a liquid crystal display device. This embodiment mode shows an example in which an electrophoretic layer 820 is sandwiched between a pixel electrode 812 and a counter electrode (common electrode) 814. The electrophoretic layer 820 includes a plurality of microcapsules 810 fixed with a binder 816. Each of the microcapsules 810 has a diameter of about 10 to 200 μm inclusive, and a transparent liquid, a positively charged white microparticle, and a negatively charged black microparticle are encapsulated therein. When an electric field is applied by the pixel electrode 812 and the counter electrode 814, the white microparticle and the black microparticle move to opposite sides in the microcapsule 810, so that white or black can be displayed. An electrophoretic element is a display element to which this principle is applied. With the use of an electrophoretic element, which has higher reflectance than a liquid crystal element, a display portion can be recognized even in a dim place without an auxiliary light (e.g. a front light). Further, power consumption is small. Furthermore, an image which is displayed once can be retained even when power is not supplied to the display portion.

Next, an example of an electronic device to which a display device (display panel) according to the present invention is applied is described. Concretely, an example in which the display device according to the present invention is applied to a mobile phone is described with reference to FIG. 17.

Figure 17:
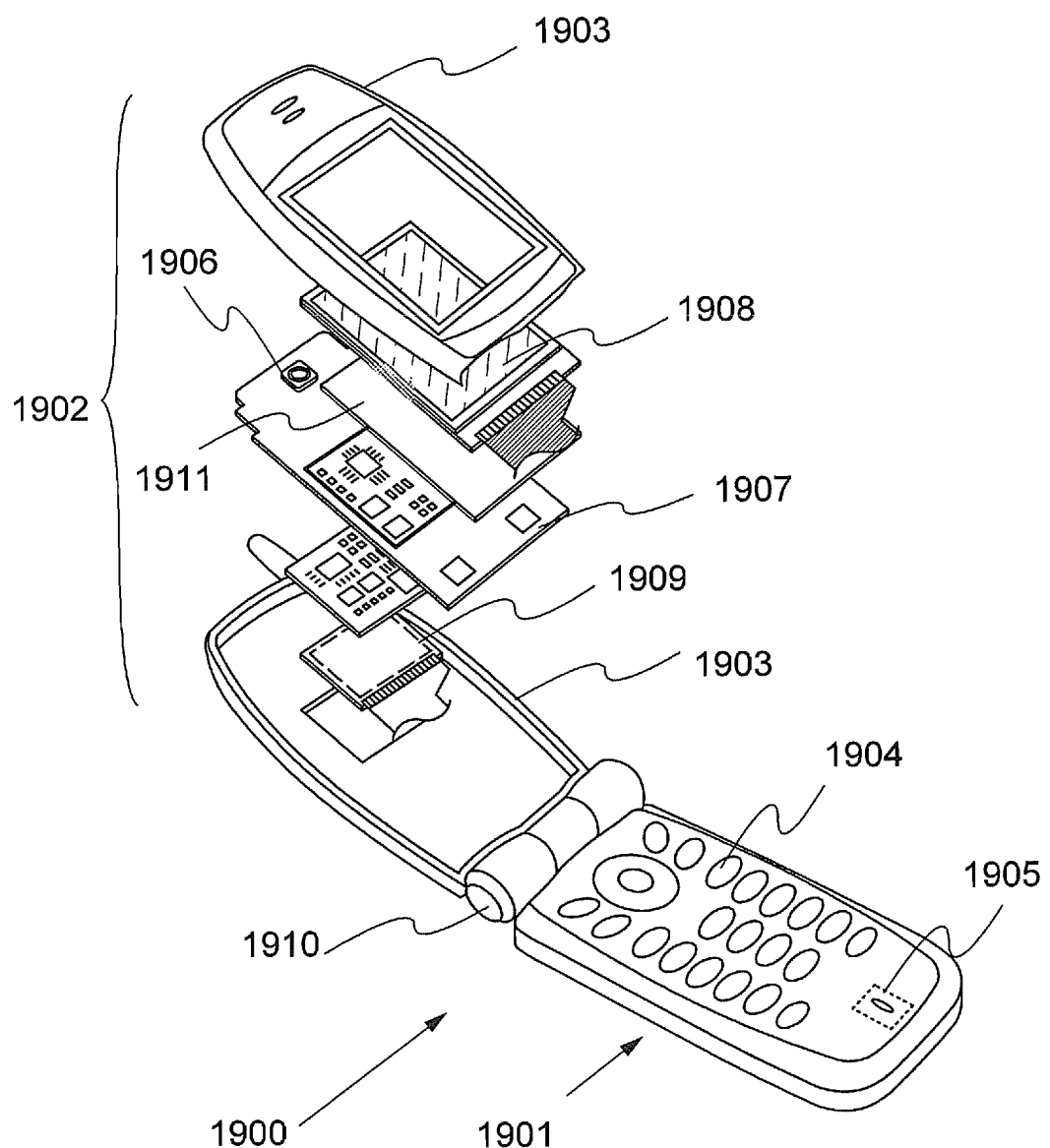
FIG. 17 is an exploded view showing an example of a display device according to the present invention.

In a mobile phone shown in FIG. 17, a main body (A) 1901 provided with operation switches 1904, a microphone 1905, and the like is connected to a main body (B) 1902 provided with a display panel (A) 1908, a backlight portion 1911, a display panel (B) 1909, a speaker 1906, and the like using a hinge 1910 so that the mobile phone can be opened and closed. The display panel (A) 1908 and the display panel (B) 1909 are placed in a housing 1903 of the main body (B) 1902 together with a circuit board 1907 and the backlight portion 1911. Display portions of the display panel (A) 1908 and the display panel (B) 1909 are arranged so as to be seen from opening windows formed in the housing 1903. In this embodiment mode, the backlight portion 1911 and the display panel (A) 1908 are arranged to overlap with each other, and a transmissive liquid crystal display device is formed. As the backlight portion 1911, a cold-cathode tube or an LED element may be used. Further, as the backlight portion, a combination of a light guide plate and an LED element may be used.

The display panel (A) 1908 and the display panel (B) 1909 are manufactured using an SOI substrate according to the present invention. Therefore, manufacture in a high yield is possible.

Specifications (e.g. the number of pixels) of the display panel (A) 1908 and the display panel (B) 1909 can be determined as appropriate according to the function of the mobile phone 1900. For example, the display panel (A) 1908 and the display panel (B) 1909 can be combined, with the former functioning as a main screen and the latter functioning as a subscreen.

A mobile phone according to this embodiment mode can take a variety of modes according to the function or usage. For example, an image pickup may be incorporated into the hinge 1910 to form a camera-equipped mobile phone. Further, the operation switches 1904, the display panel (A) 1908, and the display panel (B) 1909 may be placed in one housing.

Figure 18A:
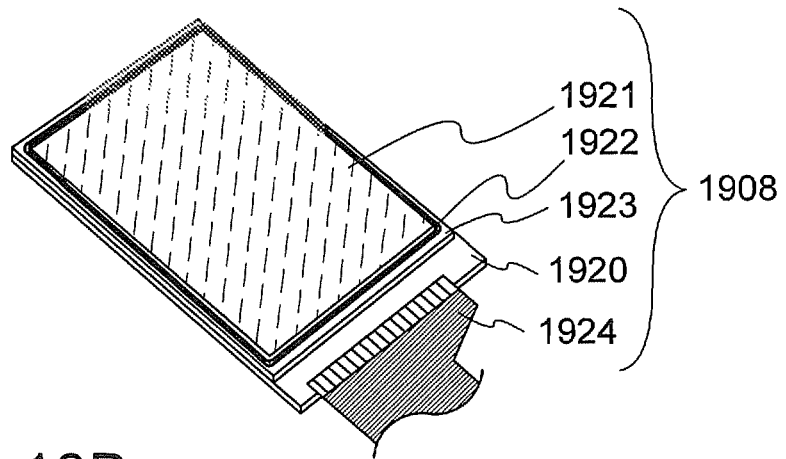
FIGS. 18A to 18C are perspective views showing an example of a display device according to the present invention.

FIG. 18A shows an example of a structure of the display panel (A) 1908. In the display panel (A) 1908, a first substrate 1920 for which a pixel electrode is provided and a second substrate 1923 facing the first substrate are attached to each other with a sealant 1922. The sealant 1922 is formed so as to surround a display portion 1921. A liquid crystal layer is provided in a region surrounded by the first substrate 1920, the second substrate 1923, and the sealant 1922 (the inside of a frame-shaped seal pattern).

Figure 18B:
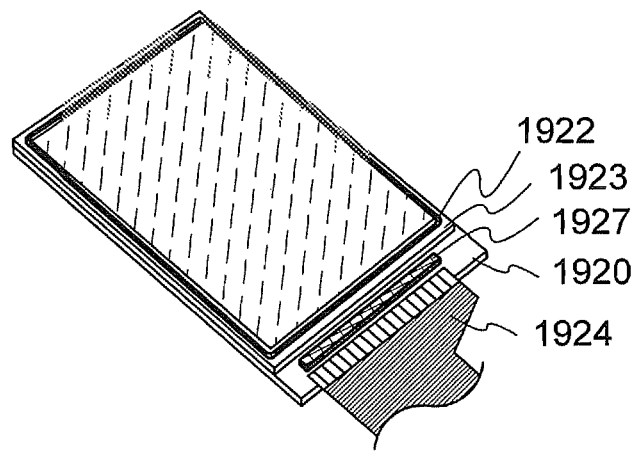

FIG. 18B shows another structure of a display panel which is different from that in FIG. 18A. In FIG. 18B, the same portions as in FIG. 18A are designated with the same reference numerals. In a panel in FIG. 18B, a drive circuit IC 1927 for driving a display portion is mounted on the first substrate 1920, so that circuits are integrated.

Figure 18C:
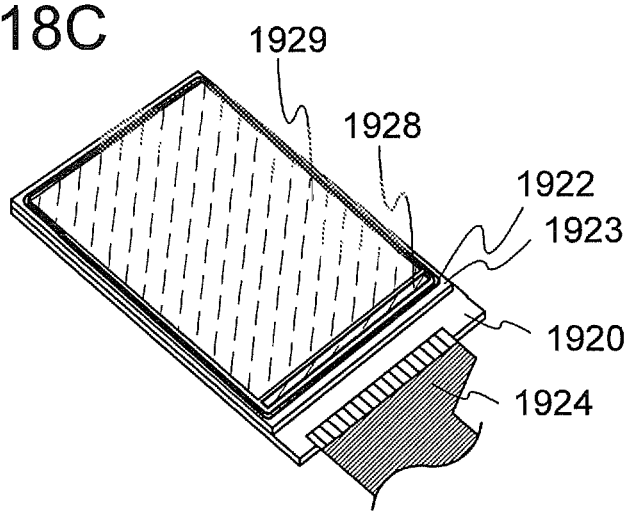

FIG. 18C shows another structure of a display panel which is different from that in FIG. 18A. In FIG. 18C, the same portions as in FIG. 18A are designated with the same reference numerals. In a panel in FIG. 18C, a drive circuit portion 1928 for driving a display portion 1929 is formed over the same substrate as the first substrate 1920. Further, not only a drive circuit but also another circuit (e.g. an optical sensor circuit or a CPU) may also be formed over the same substrate.

A desired optical film such as a polarizing plate, an anti-reflection film, or a color filter may be formed overlapping with the display panels shown in FIGS. 18A to 18C. It is noted that an FPC 1924 shown in FIGS. 18A to 18C is connected to the first substrate 1920.

By manufacturing a display device (display panel) using an SOI substrate according to the present invention, a manufacturing process can proceed all at once using a large-sized substrate, so that the productivity can be improved. Further, an SOI substrate is formed using a plurality of SOI layers; a yield can be improved by making each of the SOI layers have a size which is about equal to a desired panel size in manufacturing display devices such as display panels.

Embodiment Mode 2

This embodiment mode shows an example in which an SOI substrate is manufactured by a different method from the above embodiment mode.

Figure 23A:
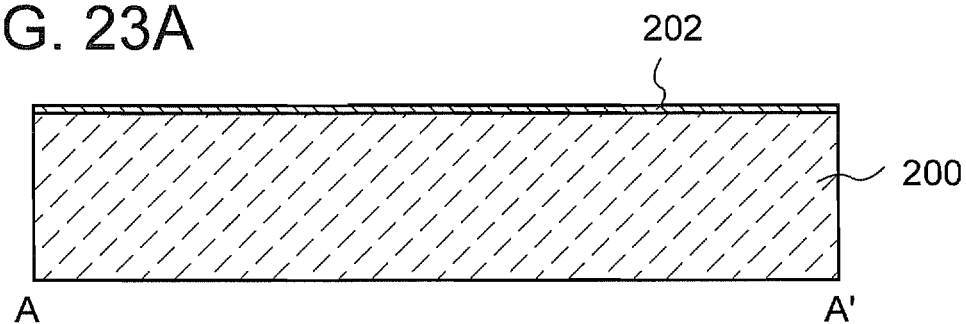
FIGS. 23A to 23D are cross-sectional views showing an example of a method for manufacturing an SOI substrate according to the present invention.

First, a semiconductor substrate 200 is provided (see FIG. 23A). For the semiconductor substrate 200, a substrate similar to the semiconductor substrate 101 may be used: for example, a silicon substrate, a germanium substrate, or a compound semiconductor substrate of gallium arsenide, indium phosphide, or the like may be used.

It is preferable that an insulating layer 202 containing nitrogen be formed over one surface of the semiconductor substrate 200. The insulating layer 202 containing nitrogen may be formed using a silicon nitride layer, a silicon nitride oxide layer, or a silicon oxynitride layer to have a single-layer structure or a stacked-layer structure. Provision of the insulating layer 202 containing nitrogen can prevent impurities such as movable ions or moisture from being diffused into an SOI layer and thus contaminating the SOI layer. Further, the insulating layer 202 containing nitrogen can function as a protective layer in performing irradiation with ions to form a separation layer.

Figure 23B:
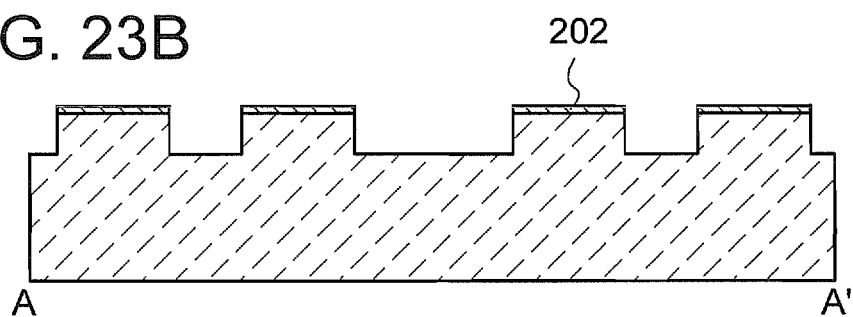

Next, the semiconductor substrate 200 is etched selectively (see FIG. 23B). In this embodiment mode, grooves (hereinafter, also referred to as recessed portions) are provided for the semiconductor substrate by etching, so that portions remaining in a shape like a top hat (hereinafter, also referred to as a projected portion) each have an area including one panel, which is a desired panel size. In this description, a process of forming grooves by etching the semiconductor substrate selectively is referred to as a "groove process".

The projected portions formed by a groove process are each formed so as to have an area including one panel, which is a desired panel size: for example, it is preferable that the panel size be a diagonal line of less than 10 in., which is a small to middle panel size. In the case where the panel is applied to a mobile phone, a known screen size is a diagonal line of about 2.4 to 3 in., and the panel size may be determined in consideration of a screen frame size in addition to the screen size. The projected portions remaining in the semiconductor substrate 200 constitute SOI layers that are transferred to a base substrate later. That is to say, projected portions are each formed so as to have an area including one panel by the groove process, so that SOI layers obtained by dividing a semiconductor substrate into sections each having an area including one panel can be transferred to a base substrate. Further, the divided projected portions are formed in plural number by the groove process, so that the SOI layers in plural number can be transferred to the base substrate.

The semiconductor substrate 200 is etched, with portions to remain covered selectively with a mask, so that projected portions each having an area including one panel, which is a desired panel size, can be obtained. A resist mask or a hard mask formed using an insulating layer may be applied to the mask. After the etching, an unnecessary mask may be removed as appropriate. Further, in this embodiment mode, the insulating layer 202 containing nitrogen is also etched selectively because the insulating layer 202 containing nitrogen is formed over the semiconductor substrate 200. Therefore, the insulating layer 202 containing nitrogen remains at the projected portions after the groove process.

The depth of etching the semiconductor substrate 200 (the depth of the groove process) is determined as appropriate in consideration of the thickness of the SOI layers that are later transferred to the base substrate. The thickness of the SOI layers can be determined by the depth into which an element that forms ions for irradiation is added. In this embodiment mode, it is preferable that the depth of the groove process of the semiconductor substrate 200 (the depth of the grooves formed) be larger than the depth of the separation layers. By making the depth of the grooves larger than the separation layers in the groove process of the semiconductor substrate 200, only the projected portions of the semiconductor substrate 200 can be easily transferred when the SOI layers are transferred to the base substrate later.

Figure 23C:
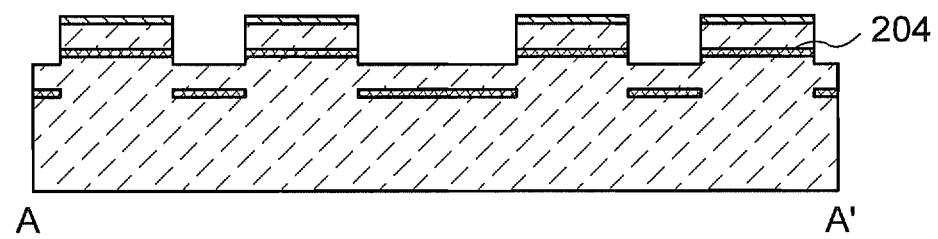

Next, the semiconductor substrate 200 is irradiated with ions accelerated by an electric field from the surface into a given depth, so that separation layers 204 are formed (see FIG. 23C). The separation layers 204 may be formed in a similar manner to FIG. 4A, and can be formed by irradiation with ions of hydrogen, helium, or halogen such as fluorine, for example. The ion irradiation is performed from the side of the semiconductor substrate 200 for which the grooves are provided (in this embodiment mode, the side for which the insulating layer 202 containing nitrogen is provided).

It is possible to form the separation layers 204 so that desired SOI layers are transferred to the base substrate, because the grooves are formed in the semiconductor substrate 200 in advance to have larger depths than that of the separation layers 204. Concretely, the separation layers 204 are formed at different depths depending on whether the separation layers 204 are formed in the projected portions or in the recessed portions of the semiconductor substrate 200. Note that in the projected portions and the recessed portions of the semiconductor substrate 200, the separation layers are formed at almost the same depths from the surface of the semiconductor substrate 200.

Figure 23D:
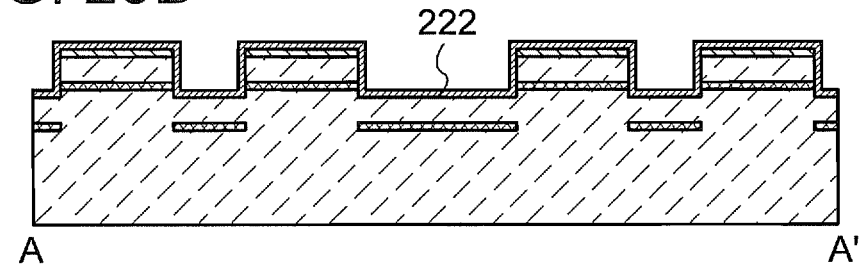

Next, a bonding layer 222 is formed on the semiconductor substrate 200 (see FIG. 23D). The bonding layer 222 is formed on the surface of the semiconductor substrate 200, which forms bonding with the base substrate. In this embodiment mode, the bonding layer 222 is formed to cover the entire surface of the semiconductor substrate 200, for which the insulating layer 202 containing nitrogen is provided. The bonding layer 222 may be formed in a similar manner to the bonding layer 122: preferably, a silicon oxide layer is formed by a chemical vapor deposition method using organic silane as a source gas.

Figure 24A:
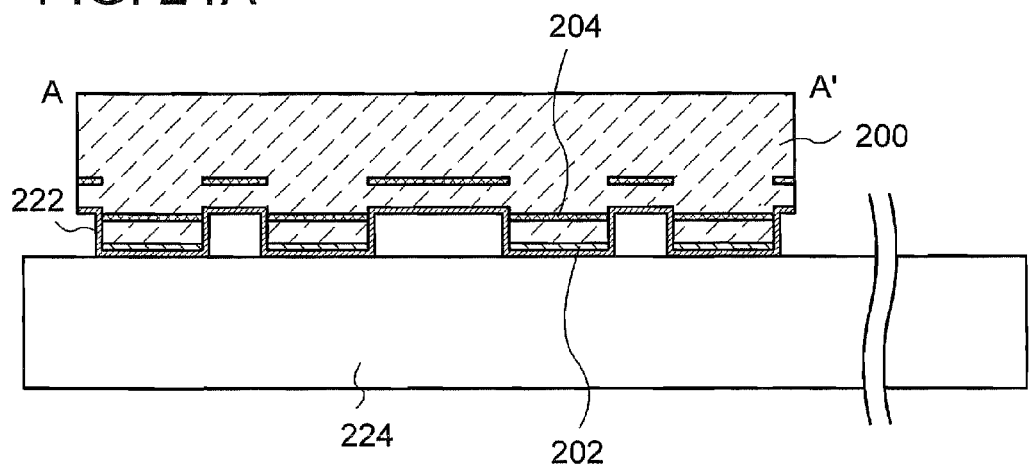
FIGS. 24A and 24B are cross-sectional views showing an example of a method for manufacturing an SOI substrate according to the present invention.

Next, the semiconductor substrate 200 is attached to a base substrate 224 (see FIG. 24A). This embodiment mode shows an example in which the surface of the semiconductor substrate 200, for which the bonding layer 222 is provided, is brought into close contact with the base substrate 224, so that the semiconductor substrate 200 and the base substrate 224 are bonded to each other. It is preferable that surfaces of both the base substrate 224 and the semiconductor substrate 200 for forming bonding be cleaned sufficiently in advance. The close contact of the base substrate 224 and the bonding layer 222 forms bonding. Van der Waals force acts on this bonding, and the base substrate 224 and the semiconductor substrate 200 are bonded to each other by being pressed, so that the firm bonding due to a hydrogen bond can be formed. In this embodiment mode, the semiconductor substrate 200 is processed to have the grooves, so that the projected portions are in contact with the base substrate 224.

A bonding surface (in this embodiment mode, the surfaces of the bonding layer 222 and of the base substrate 224) may be activated by irradiation with an atomic beam or an ion beam, or plasma or radical treatment, in a similar manner to Embodiment Mode 1. Activation of the bonding surfaces in advance enables easy bonding between different materials.

Further, it is preferable to perform heat treatment or pressure treatment after bonding the base substrate 224 and the semiconductor substrate 200 to each other with the bonding layer 222 interposed therebetween.

Figure 24B:
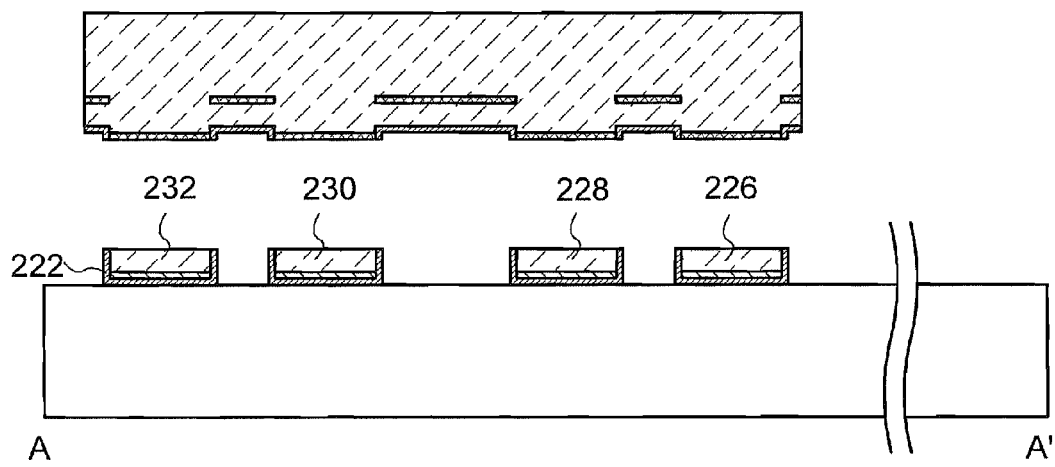

Next, heat treatment is performed, so that part of the semiconductor substrate 200 is separated from the base substrate 224, the separation layers 204 functioning as cleavage planes. In this embodiment mode, the grooves are formed in the semiconductor substrate 200 to have a larger depth than that of the separation layers 204, and the separation layers 204 are formed at different depths depending on whether formed in the grooves or not. Further, in the bonding layer 222 provided for the semiconductor substrate 200, only the projected portions are in contact with the base substrate 224. Therefore, only the projected portions of the semiconductor substrate 200 can remain as SOI layers over the base substrate 224. Accordingly, the SOI layers each having a desired panel size and the same crystallinity as that of the semiconductor substrate 200 remain over the base substrate 224. If a plurality of projected portions each having a desired panel size are formed in the semiconductor substrate 200, a plurality of SOI layers can be formed over the base substrate. FIG. 24B shows an example in which four SOI layers 226, 228, 230, and 232 remain over the base substrate 224 for sake of convenience.

It is preferable to perform the heat treatment for separation at a temperature higher than of equal to the film formation temperature of the bonding layer 222 and less than or equal to the heat-resistant temperature of the base substrate 224. For example, if heat treatment is performed at 400 to 600° C. inclusive, there occurs a change in volume of a minute cavity formed in the separation layer 204 and thus separation along the separation layer 204 is possible.

Further, CMP, laser beam irradiation, or the like may be performed in order to planarize or thin the obtained SOI layers by separation.

In the above manner, an SOI substrate for which a plurality of SOI layers are provided over the base substrate 224 with the bonding layer 222 interposed therebetween can be obtained. FIG. 24B shows an example in which the four SOI layers 226, 228, 230, and 232 remain over the base substrate 224 with the bonding layer 222 interposed therebetween for sake of convenience.

It is preferable to transfer the SOI layers in almost the same range as that of one-time exposure with a light exposure apparatus in a block to the base substrate. Concretely, it is preferable to transfer the SOI layers in almost the same range as that of one-time exposure with a light exposure apparatus in a block when the plurality of SOI layers are transferred to the base substrate to form an SOI substrate. That is to say, it is preferable that the block of transferred SOI layers have almost the same area as that of the range of one-time light exposure. In this description, hereinafter, the range of one-time exposure with a light exposure apparatus is referred to as a "one shot size." Further, it is preferable to transfer an alignment marker together with the SOI layers.

Figure 25A:
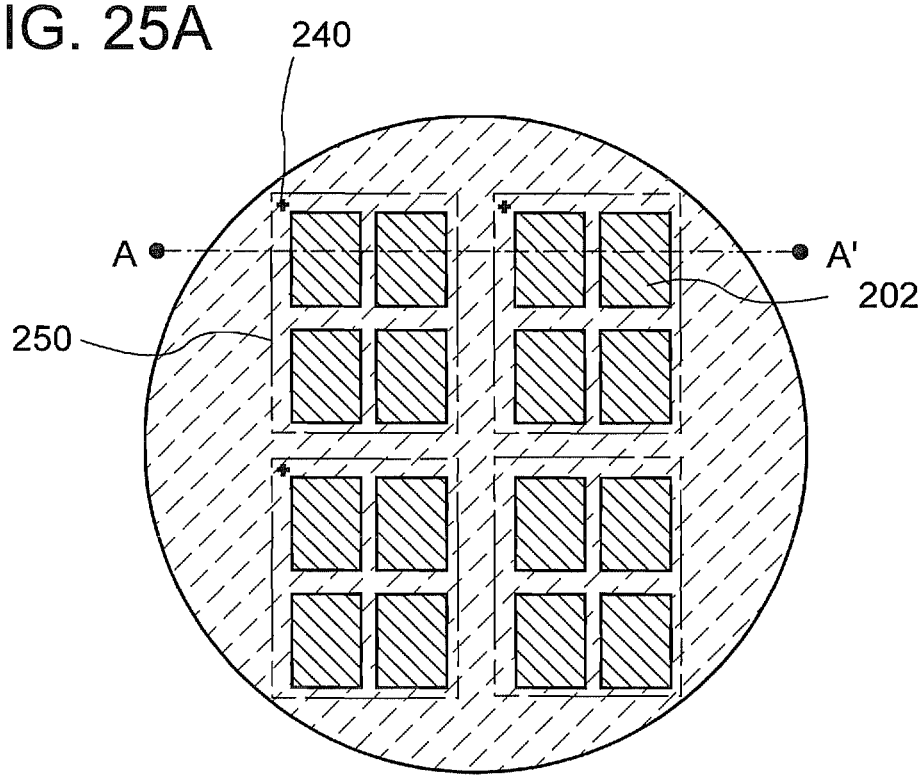
FIGS. 25A and 25B are top views showing an example of an SOI substrate according to the present invention.

Here, a schematic view of a top surface of the semiconductor substrate 200 after the groove process is shown in FIG. 25A. A cross-sectional view taken along a line AA' in FIG. 25A corresponds to FIG. 23B.

The semiconductor substrate 200 is etched selectively, so that the insulating layer 202 containing nitrogen remains at portions corresponding to projected portions in FIG. 23B. In the top view, the projected portions formed in the semiconductor substrate 200 each have an area including one panel, which is a desired panel size, at the surfaces. In this embodiment mode, in the top view, the insulating layer 202 containing nitrogen is divided into sections that each has an area including one panel, which is a desired panel size, to remain over the semiconductor substrate 200. The projected portions formed in the semiconductor substrate 200 are located under the insulating layer 202 containing nitrogen.

In a manufacturing field of display devices, semiconductor devices, and the like, photolithography is applied to forming a minute pattern or the like in many cases. In the photolithography, a desired pattern form is transferred to a resist layer applied over a substrate using a light exposure apparatus typified by a stepper, and then a desired pattern is formed over the substrate using the pattern form. For example, a circuit pattern is formed as the desired pattern form in a resist layer applied over a substrate, and a circuit including a transistor is formed over the substrate using the circuit pattern. One shot size of a light exposure apparatus depends on the apparatus; in using an existing stepper, the one shot size is about 25 mm square, 100 mm square, 113 mm square, 132 mm square, or 144 mm square, and it is difficult to expose a large-sized substrate with a side of more than 1 meter long with light at one time. Therefore, if a group of SOI layers of one shot size of a light exposure apparatus are transferred in a block, a desired circuit pattern can be formed efficiently. This is because one group of SOI layers can be exposed to light at a time to form a desired pattern (e.g. a circuit pattern), by transferring the group of SOI layers of one shot size in a block. The circuit pattern is formed in each of the SOI layers that constitute the group of SOI layers, and for example, a circuit pattern including a transistor can be formed in each of the SOI layers. Note that each of the SOI layers that constitute one group of SOI layers has an area including one panel, which is a desired panel size, by division of an SOI layer.

In FIG. 25A, a region 250 of one shot size of a stepper is surrounded by broken lines. In the semiconductor substrate 200, regions which are transferred as SOI layers are etched selectively so that the region 250 of one shot size of a stepper is effectively arranged in a block.

In the region 250, a portion 240 which functions as an alignment marker is left. The portion 240 which functions as an alignment marker can be left by being covered with a mask together when portions which become SOI layers are covered selectively with the mask. In the semiconductor substrate 200 shown in FIG. 25A, the insulating layer 202 containing nitrogen is also left at the portion 240 which functions as an alignment marker. The portion 240 which functions as an alignment marker is not drawn in a cross-sectional view.

Figure 25B:
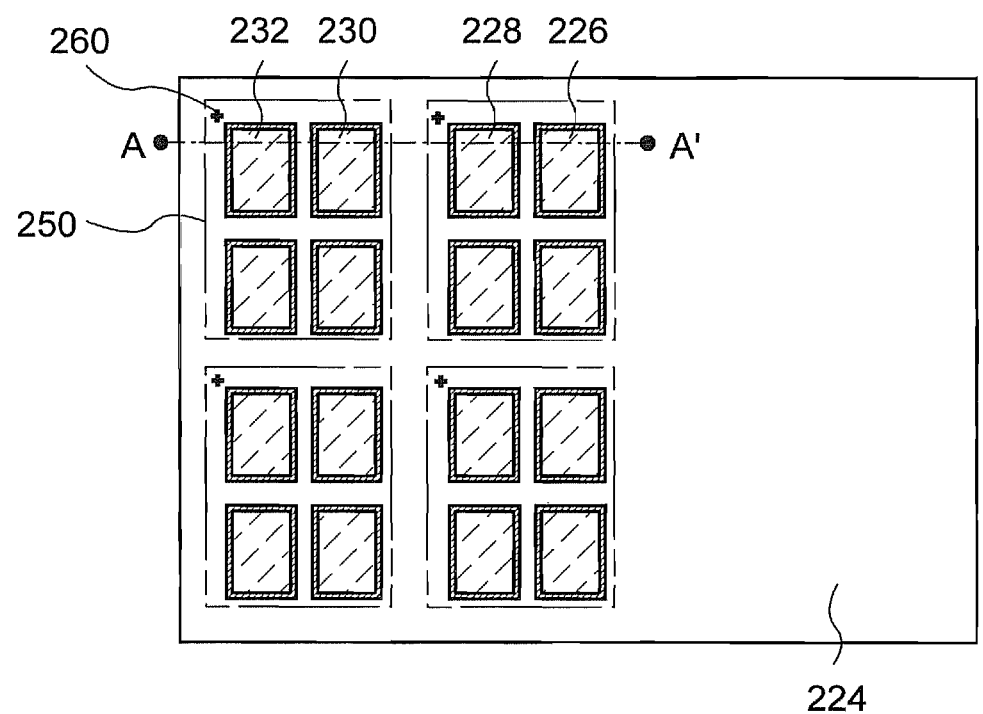

FIG. 25B is a schematic view of a top surface of the base substrate 224 to which the SOI layers are transferred. A cross-sectional view taken along a line AA' in FIG. 25B corresponds to FIG. 24B.

Over the base substrate 224, a group of SOI layers are arranged systematically in a block, the region 250 of one shot size of a stepper being one unit. Further, an alignment marker 260 having the same crystallinity as that of the SOI layers is also formed.

In FIG. 25B, one alignment marker and a plurality of SOI layers are provided in the region 250 of one shot size of a stepper. That is to say, the alignment marker and the SOI layers are transferred to the base substrate so that the plurality of single-crystalline semiconductor layers belong to the one alignment marker.

In the case where a display device is manufactured using the SOI substrate shown in FIG. 25B in a similar manner to Embodiment Mode 1, photolithography can be performed in the following manner: positional alignment is adjusted with the alignment marker 260, and the SOI layers in the region 250 of one shot size are exposed to light at a time. Further, the SOI layers are arranged in consideration of one shot size of a stepper and the SOI layers each have a desired panel size, so that a pattern can be formed efficiently.

Figure 26A:
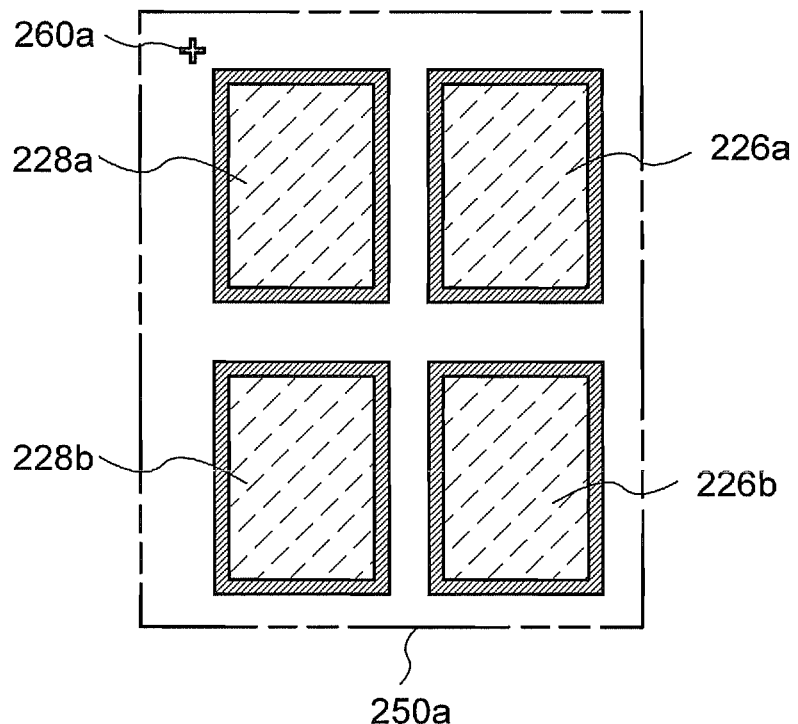
FIGS. 26A and 26B are top views showing an example of an SOI substrate according to the present invention.

As an example, one of the regions 250 of one shot size of a stepper, over the base substrate 224 is described with reference to FIGS. 26A and 26B. In FIG. 26A, SOI layers 226a, 226b, 228a, and 228b are arranged in a region 250a, for one alignment marker 260a. The SOI layers 226a, 226b, 228a, and 228b each have a desired panel size. The SOI layers 226a, 226b, 228a, and 228b are located in the region 250a and form one block.

Figure 26B:
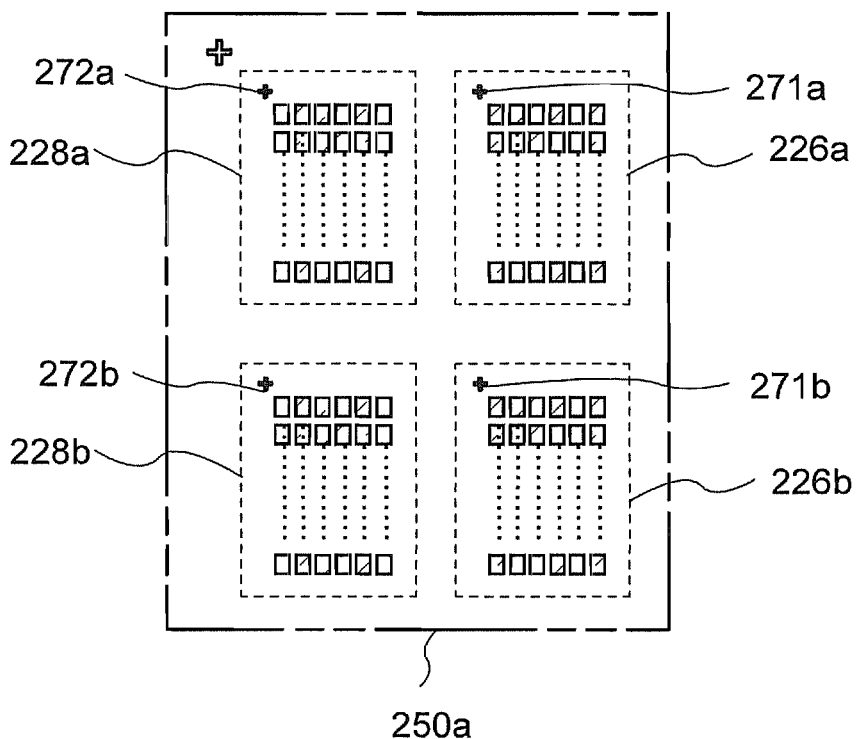

FIG. 26B shows an example in which positional alignment is performed with the alignment marker 260a, and the SOI layers 226a, 226b, 228a, and 228b are etched selectively, so that a desired pattern is formed. A circuit pattern is transferred by exposing one block including the SOI layers 226a, 226b, 228a, and 228b to light at a time, for example. At this time, if the alignment marker 260a is present, positional alignment or the like can be performed easily in photolithography. The pattern of each of the SOI layers after the etching can form a channel portion of a transistor formed in a circuit portion, for example. Through other steps further, a circuit including a transistor can be formed using each of the SOI layers.

It is preferable to form an alignment marker for later pattern forming (of a gate electrode or the like) when the SOI layer is etched selectively using the circuit pattern formed by being exposed to light and transferred at a time, to form a desired SOI pattern for forming a channel portion or the like of a transistor. For example, FIG. 26B shows an example in which alignment markers 271a, 271b, 272a, and 272b are each formed in each of the panel formation regions. Although it is possible to perform positional alignment for later pattern forming with the alignment marker 260a, which has been formed in the above step, it is preferable to form a new alignment marker in order to be adaptable to a minute pattern form. In such a manner, positional alignment or the like can be performed easily in forming a minute pattern form.

Although an example is shown here in which four SOI layers are defined as one block and one shot size of a stepper is defined as one unit for sake of convenience, the present invention is not particularly limited to this example. The number of SOI layers that construct one unit is optional. That is to say, the optional number of SOI layers can be selected from a plurality of transferred SOI layers to form one unit.

This embodiment mode can be performed in free combination with Embodiment Mode 1.

Embodiment Mode 3

This embodiment mode shows an example in which an element with a different structure from those of the above embodiment modes is manufactured using an SOI substrate according to the present invention. Concretely, a structure in which an insulating layer is embedded between SOI layers, as an element isolation structure, is described with reference to FIGS. 19A to 20B.

Figure 19A:
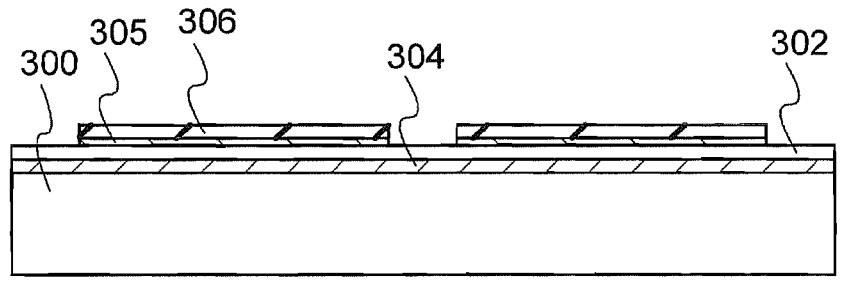
FIGS. 19A and 19E are cross-sectional views showing an example of a method for manufacturing a display device according to the present invention.

In FIG. 19A, an SOI layer 302 is provided for a base substrate 300 with a bonding layer 304 interposed therebetween. The SOI layer 302 has a desired panel size. A silicon nitride layer 305 and a silicon oxide layer 306 are formed over the SOI layer 302 so as to match an element formation region. The silicon oxide layer 306 is used as a hard mask for etching the SOI layer 302 in order to isolate elements. The silicon nitride layer 305 functions as an etching stopper.

It is preferable that the SOI layer 302 has a thickness of 5 to 500 nm inclusive, preferably, 10 to 200 nm inclusive. The thickness of the SOI layer 302 can be set as appropriate by controlling the depth of the separation layer described in the above embodiment modes. A p-type impurity element such as boron, aluminum, gallium, or the like is added to the SOI layer 302 in order to control a threshold voltage. For example, boron may be added at a concentration of $5 \times 10^{17}$ cm$^{-3}$ to $1 \times 10^{18}$ cm$^{-3}$ inclusive.

Figure 19B:
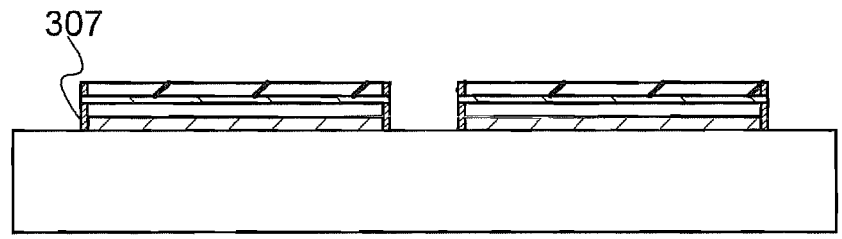

FIG. 19B shows a step of etching the SOI layer 302 and the bonding layer 304 using the silicon oxide layer 306 as a mask. And then, plasma treatment is performed to nitride exposed end surfaces of the silicon oxide layer 306, the silicon nitride layer 305, the SOI layer 302, and the bonding layer 304. With the nitridation treatment, nitridation processed layers 307 are formed at least at the peripheral end portions of the silicon oxide layer 306, the silicon nitride layer 305, the SOI layer 302, and the bonding layer 304. Further, as part of the nitridation processed layers 307, silicon nitride layers are formed at least at the peripheral end portions of the SOI layer 302. The silicon nitride layers formed at the peripheral end portions of the SOI layer 302 have an insulating property, and have an effect of preventing leak current from flowing at the end surfaces of the SOI layer 302. Further, the nitridation processed layers 307 have an anti-oxidation property, and thus can prevent a "bird's beak" from being formed by growth of oxide films from the end surfaces between the SOI layer 302 and the bonding layer 304.

Figure 19C:
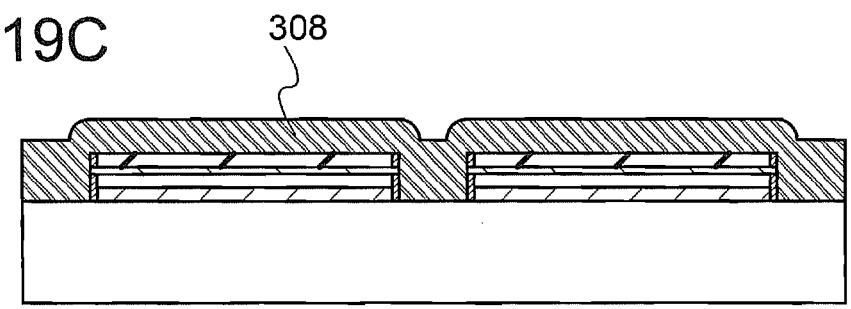

FIG. 19C shows a step of depositing an element isolation insulating layer 308. As the element isolation insulating layer 308, a silicon oxide layer is deposited by a chemical vapor deposition method using TEOS as a source gas. The element isolation insulating layer 308 is deposited with a large thickness so that the SOI layer 302 is embedded.

Figure 19D:
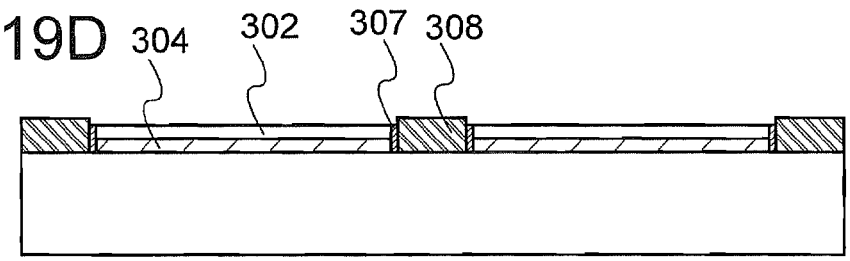

FIG. 19D shows a step of removing the element isolation insulating layer 308 until the silicon nitride layer 305 is exposed. This removal step can be performed by dry etching, or may be performed by chemical mechanical polishing. The silicon nitride layer 305 functions as an etching stopper. The element isolation insulating layer 308 is left to be embedded between the SOI layers 302. The silicon nitride layer 305 is removed thereafter.

Figure 19E:
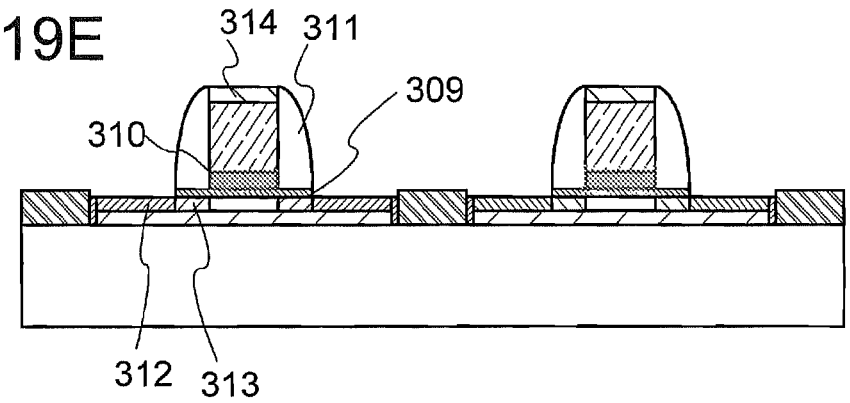

In FIG. 19E, after the SOI layer 302 is exposed, a gate insulating layer 309, a gate electrode 310, and a sidewall insulating layer 311; then a high concentration impurity region 312, and a low concentration impurity region 313 are formed. An insulating layer 314 is formed using silicon nitride, and is used as a hard mask for etching the gate electrode 310.

Figure 20A:
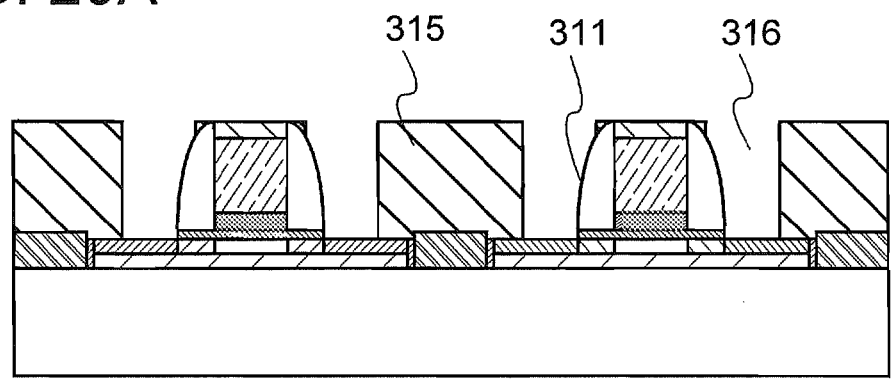
FIGS. 20A and 20B are cross-sectional views showing an example of a method for manufacturing a display device according to the present invention.

In FIG. 20A, an interlayer insulating layer 315 is formed. As the interlayer insulating layer 315, a BPSG (boron phosphorus silicon glass) layer is formed and planarized by reflow. As the interlayer insulating layer 315, a silicon oxide layer may also be formed using TEOS as a source gas and planarized by a chemical mechanical polishing process. In the planarizing process, the insulating layer 314 over the gate electrode 310 functions as an etching stopper. Contact holes 316 are formed in the interlayer insulating layer 315. The contact holes 316 have a structure of self-align contact using the sidewall insulating layer 311.

Figure 20B:
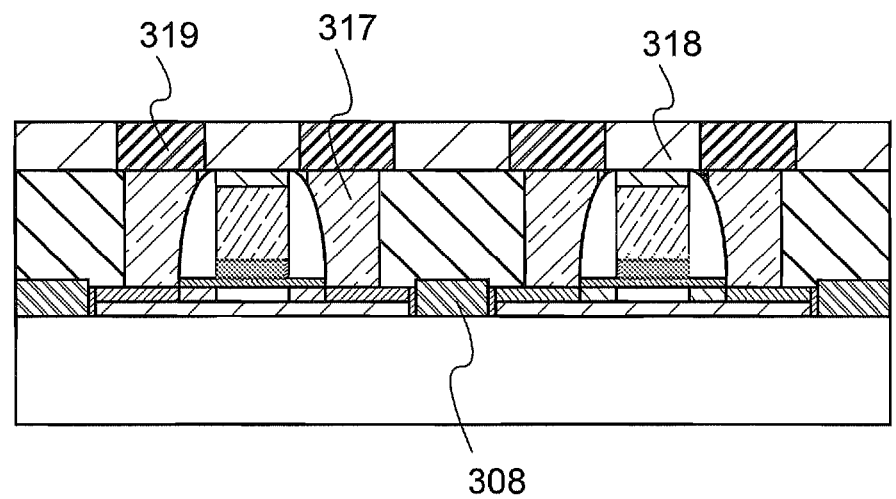

After that, as shown in FIG. 20B, contact plugs 317 are formed by a CVD method using tungsten hexafluoride. Further, an insulating layer 318 is formed. Openings are formed in the insulating layer 318 so as to match the contact plugs 317, and wirings 319 are formed therein. The wirings 319 are formed using aluminum or an aluminum alloy, and a metal film of molybdenum, chromium, titanium, or the like is formed as a barrier metal at upper and lower layers.

In such a manner, transistors can be manufactured using the SOI layer 302 bonded to the base substrate 300. The transistors shown in this embodiment mode can be applied to a pixel circuit portion, a peripheral circuit portion, or the like of a display device according to the present invention. In accordance with this embodiment mode, with the use of the SOI substrate manufactured according to Embodiment Mode 1 or 2, elements constituting one display panel using one SOI layer can be formed; therefore, variation in characteristics can be suppressed. Further, an SOI substrate is formed using a plurality of SOI layers, and a yield can be improved by making each of the SOI layers have a size which is about equal to a desired panel size in manufacturing display devices.

This embodiment mode can be performed in free combination with Embodiment Mode 1 or 2.

This application is based on Japanese Patent Application serial No. 2007-106578 filed with Japan Patent office on Apr. 13, 2007, the entire contents of which are hereby incorporated by reference.

What is claimed is:

1. A method for manufacturing a display device, comprising the steps of:
    forming a plurality of projected portions each having an area including one panel in a first substrate by etching the first substrate;
    implanting an ion into the first substrate to form a plurality of single-crystalline semiconductor layers each having an area including one panel in the plurality of projected portions, respectively;
    bonding the plurality of single-crystalline semiconductor layers to a second substrate with an insulating layer interposed therebetween;
    exposing a first single-crystalline semiconductor layer and a second single-crystalline semiconductor layer each selected from the plurality of single-crystalline semiconductor layers at a time, wherein each of the first single-crystalline semiconductor layer and the second single-crystalline semiconductor layer has an area including one panel; and
    patterning the first single-crystalline semiconductor layer and the second singel-crystalline semiconductor layer to form a first display portion over the second substrate by using a patterned first single-crystalline semiconductor layer and a second display portion over the second substrate by using a patterned second single-crystalline semiconductor layer,
    wherein the insulating layer is a silicon oxide layer formed by a chemical vapor deposition method using an organic silane as a source gas.

2. The method for manufacturing a display device according to claim 1, wherein the organic silane is one selected from the group consisting of tetraethoxysilane, trimethylsilane, tetramethylsilane, tetramethylcyclotetrasiloxane, octamethylcyclotetrasiloxane, hexamethyldisilazane, triethoxysilane, and trisdimethylaminosilane.

3. The method for manufacturing a display device according to claim 1, wherein the first single-layer semiconductor layer and the second single-crystalline semiconductor layer are provided in a range exposed one time with a light exposure apparatus.

4. The method for manufacturing a display device according to claim 1, wherein the first substrate is a semiconductor substrate.

5. The method for manufacturing a display device according to claim 1, wherein the second substrate is one selected from the group consisting of an aluminosilicate glass, an aluminoborosilicate glass, a barium borosilicate glass, a quartz substrate, a sapphire substrate, and a ceramic substrate.

6. The method for manufacturing a display device according to claim 1, wherein the area including one panel is less than 10 inches in diagonal line.

7. A method for manufacturing a display device, comprising the steps of:
forming a plurality of projected portions each having an area including one panel in a first substrate by etching the first substrate;
implanting an ion into the first substrate to form a plurality of single-crystalline semiconductor layers each having an area including one panel in the plurality of projected portions, respectively;
bonding the plurality of single-crystalline semiconductor layers to a second substrate with an insulating layer interposed therebetween; and
patterning the plurality of single-crystalline semiconductor layers to form a plurality of display portions over the second substrate by using each of a plurality of patterned single-crystalline semiconductor layers,
wherein the insulating layer is a silicon oxide layer formed by a chemical vapor deposition method using an organic silane as a source gas.

8. The method for manufacturing a display device according to claim 7, wherein the organic silane is one selected from the group consisting of tetraethoxysilane, trimethylsilane, tetramethylsilane, tetramethylcyclotetrasiloxane, octamethylcyclotetrasiloxane, hexamethyldisilazane, triethoxysilane, and trisdimethylaminosilane.

9. The method for manufacturing a display device according to claim 7, wherein the first substrate is a semiconductor substrate.

10. The method for manufacturing a display device according to claim 7, wherein the second substrate is one selected from the group consisting of an aluminosilicate glass, an aluminoborosilicate glass, a barium borosilicate glass, a quartz substrate, a sapphire substrate, and a ceramic substrate.

11. The method for manufacturing a display device according to claim 7, wherein the area including one panel is less than 10 inches in diagonal line.

12. The method for manufacturing a display device according to claim 7, wherein the plurality of single-crystalline semiconductor layers including at least a first single-crystalline semiconductor layer, a second single-crystalline semiconductor layer, a third single-crystalline semiconductor layer, and a fourth single-crystalline semiconductor layer each having the area including one panel.

13. The method for manufacturing a display device according to claim 12, further comprising the steps of:
exposing a first group including at least the first single-crystalline semiconductor layer and the second single-crystalline semiconductor layer after bonding the plurality of single-crystalline semiconductor layers to the second substrate; and
exposing a second group including at least the third single-crystalline semiconductor layer and the fourth single-crystalline semiconductor layer after exposing the first group and before patterning the plurality of single-crystalline semiconductor layers.

14. A method for manufacturing a display device, comprising the steps of:
forming a plurality of projected portions each having an area including one panel in a semiconductor substrate by etching the semiconductor substrate;
implanting an ion into the semiconductor substrate to form an ion-doped layer in each of the plurality of projected portions, respectively;
bonding the plurality of projected portions to a base substrate with an insulating layer interposed therebetween;
forming a plurality of semiconductor layers over the base substrate by separating the plurality of projected portions each along a part of the ion-doped layer, wherein the plurality of semiconductor layers including at least a first semiconductor layer and a second semiconductor layer each having the area including one panel;
exposing a group including at least the first semiconductor layer and the second semiconductor layer; and
patterning at least the first semiconductor layer and the second semiconductor layer to form a first display portion using a patterned first semiconductor layer and to form a second display portion using a patterned second semiconductor layer,
wherein the step of patterning is performed after the step of bonding, and
wherein the insulating layer is a silicon oxide layer formed by a chemical vapor deposition method using an organic silane as a source gas.

15. The method for manufacturing a display device according to claim 14, wherein the organic silane is one selected from the group consisting of tetraethoxysilane, trimethylsilane, tetramethylsilane, tetramethylcyclotetrasiloxane, octamethylcyclotetrasiloxane, hexamethyldisilazane, triethoxysilane, and trisdimethylaminosilane.

16. The method for manufacturing a display device according to claim 14, wherein the group including at least the first semiconductor layer and the second semiconductor layer is provided in a range exposed one time with a light exposure apparatus.

17. The method for manufacturing a display device according to claim 14, wherein the semiconductor substrate is a single-crystalline semiconductor substrate.

18. The method for manufacturing a display device according to claim 14, wherein the base substrate is one selected from the group consisting of an aluminosilicate glass, an aluminoborosilicate glass, a barium borosilicate glass, a quartz substrate, a sapphire substrate, and a ceramic substrate.

19. The method for manufacturing a display device according to claim 14, wherein the area including one panel is less than 10 inches in diagonal line.

* * * * *

UNITED STATES PATENT AND TRADEMARK OFFICE
CERTIFICATE OF CORRECTION

PATENT NO. : 8,748,243 B2
APPLICATION NO. : 13/249308
DATED : June 10, 2014
INVENTOR(S) : Shunpei Yamazaki It is certified that error appears in the above-identified patent and that said Letters Patent is hereby corrected as shown below:

In the Claims:

In claim 1, at column 34, line 39, "singel" should be --single--;

In claim 3, at column 34, line 55, "single-layer" should be --single-crystalline--.

Signed and Sealed this
Fourteenth Day of October, 2014

Michelle K. Lee
*Deputy Director of the United States Patent and Trademark Office*